United States Patent [19]

Kasai

[11] Patent Number: 5,648,668

[45] Date of Patent: Jul. 15, 1997

[54] HIGH BREAKDOWN VOLTAGE FIELD EFFECT TRANSISTOR

[75] Inventor: Nobuyuki Kasai, Itami, Japan

[73] Assignee: Mitsubishi Denki Kabushiki Kaisha, Tokyo, Japan

[21] Appl. No.: 550,627

[22] Filed: Oct. 31, 1995

[30] Foreign Application Priority Data

Nov. 1, 1994 [JP] Japan .................... 6-268592
Jun. 15, 1995 [JP] Japan .................... 7-148731

[51] Int. Cl.$^6$ .................... H01L 31/0328; H01L 29/80; H01L 29/76
[52] U.S. Cl. .................... 257/280; 257/192; 257/412
[58] Field of Search .................... 257/280, 282, 257/283, 284, 192, 194, 409, 656, 412

[56] References Cited

U.S. PATENT DOCUMENTS

| 5,324,969 | 6/1994 | Murai et al. | 257/280 |
| 5,351,128 | 9/1994 | Goto et al. | 257/192 |

FOREIGN PATENT DOCUMENTS

| 228332 | 1/1990 | Japan . |
| 2105469 | 4/1990 | Japan . |
| 3191532 | 8/1991 | Japan . |
| 5267346 | 10/1993 | Japan . |

OTHER PUBLICATIONS

Kuwata et al. "High Breakdown Voltage MESFET With Planar Gate Structure For Low Distortion Power Applications", IEEE GaAs IC Symposium, 1993, pp. 181–184.

Primary Examiner—Wael Fahmy
Attorney, Agent, or Firm—Leydig, Voit & Mayer

[57] ABSTRACT

A semiconductor device includes a drain electrode, a source electrode, and a gate electrode on a semiconductor substrate; a semiconductor layer on a region of the semiconductor substrate and including a first dopant concentration region on which the gate electrode is centrally disposed; a second dopant concentration region more heavily doped than the first dopant concentration region, disposed adjacent the first dopant concentration region and having a length toward the drain electrode; third dopant concentration regions, more heavily doped than the second dopant concentration region, respectively disposed adjacent the second dopant concentration region at drain side and adjacent the first dopant concentration region at the source side; a drain electrode disposed on one of the third dopant concentration regions; and a source electrode disposed on the other of the third dopant concentration regions. Even when the second dopant concentration region is etched while producing a sidewall in producing the semiconductor device, the depth of the surface depletion layer on the etched part is shallow so that channel confinement is relaxed. In addition, even when an electric field is concentrated toward the drain side of the first dopant concentration region, the electric field at the third dopant concentration region is relaxed.

1 Claim, 20 Drawing Sheets

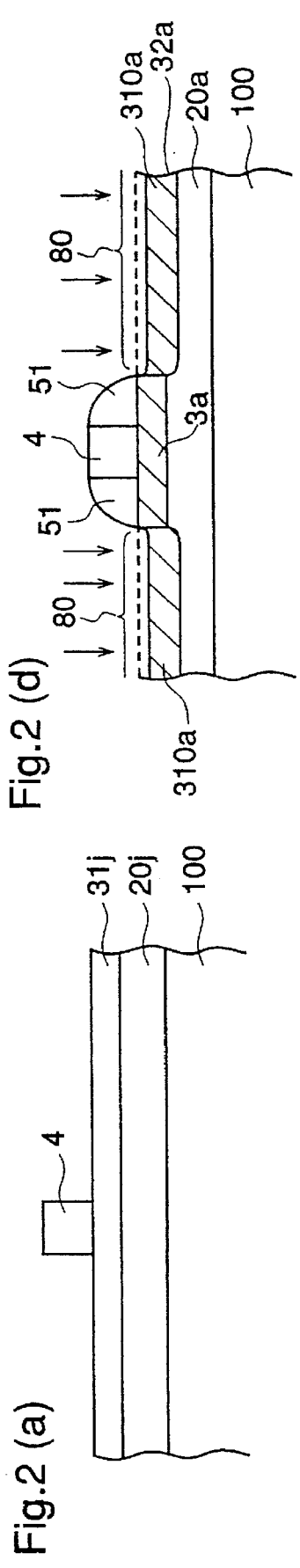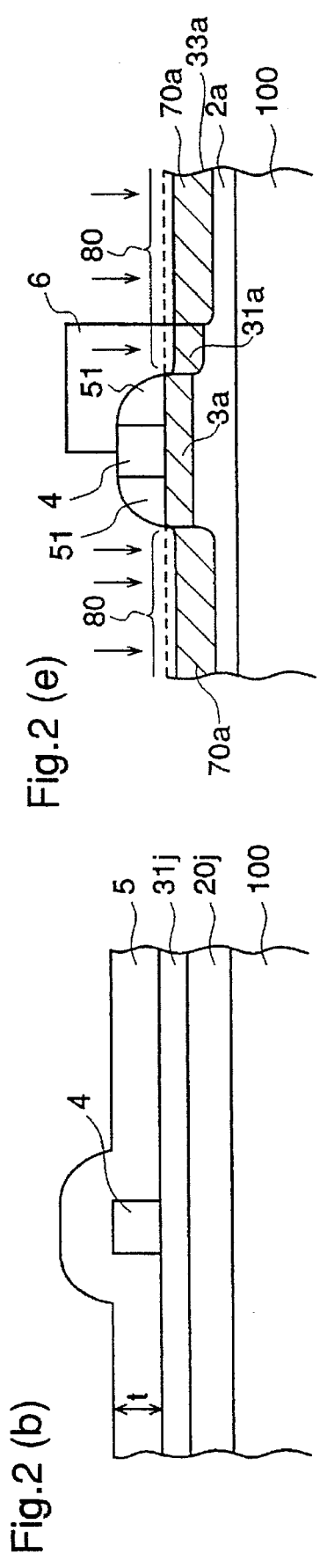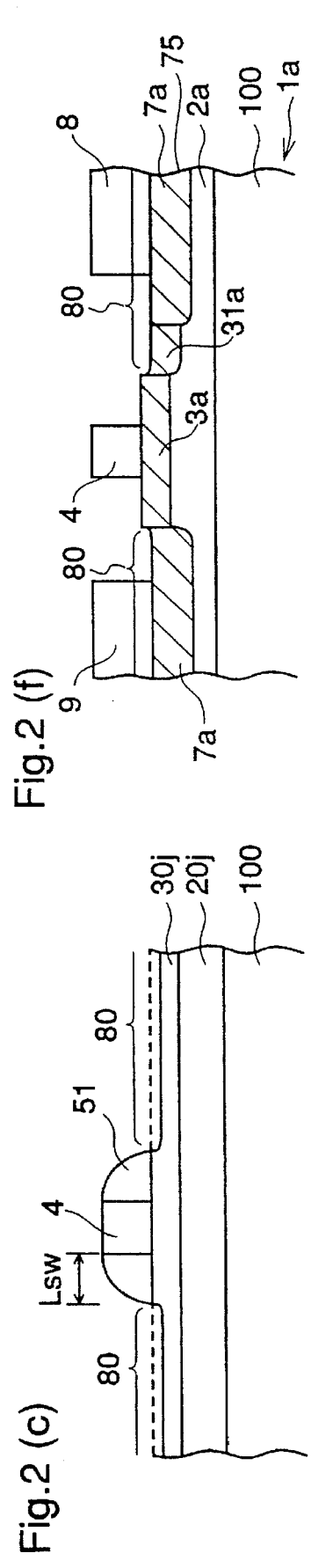

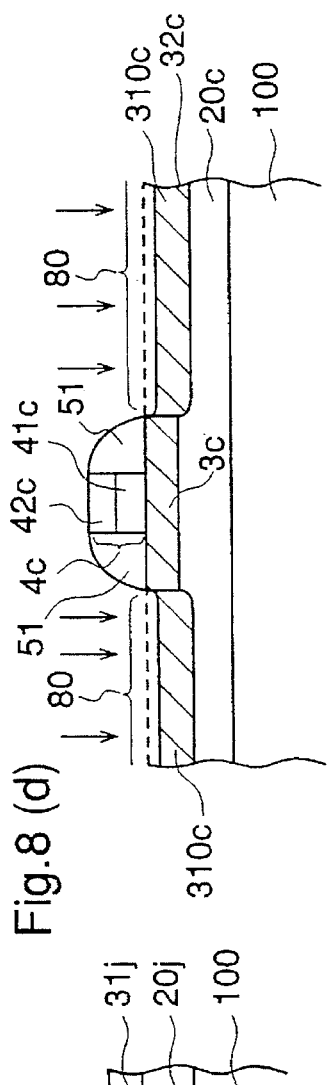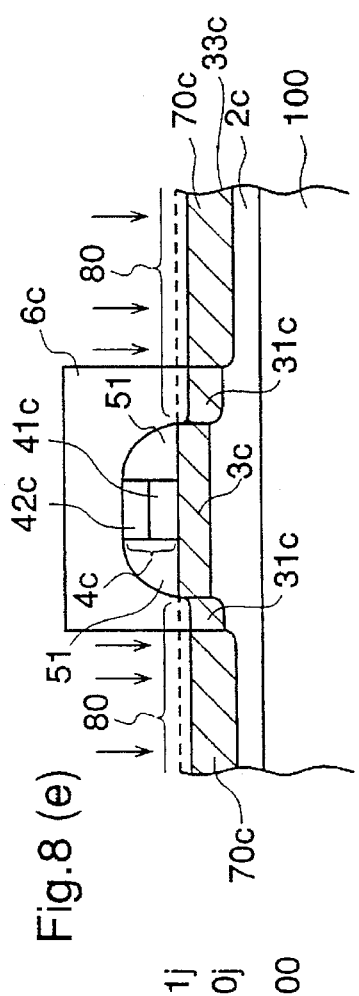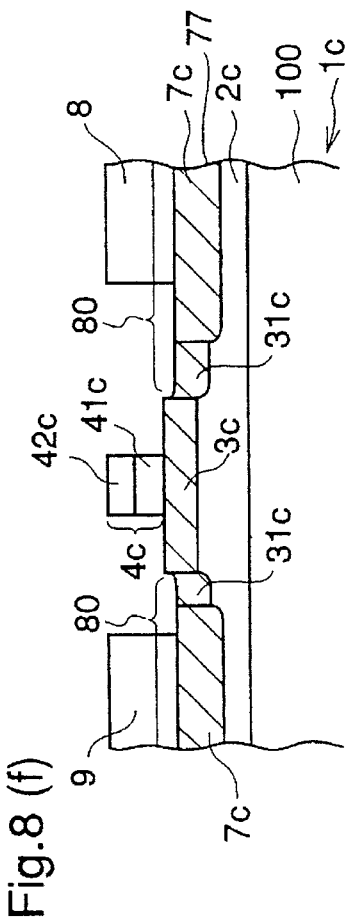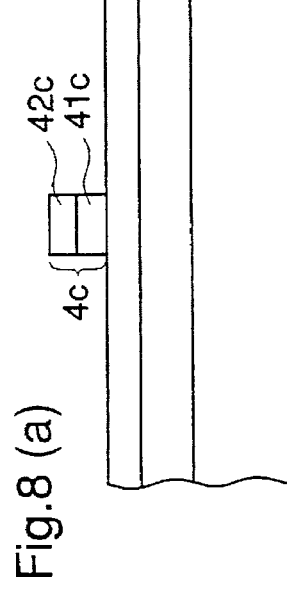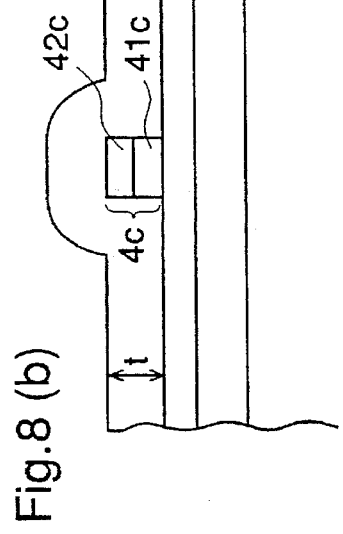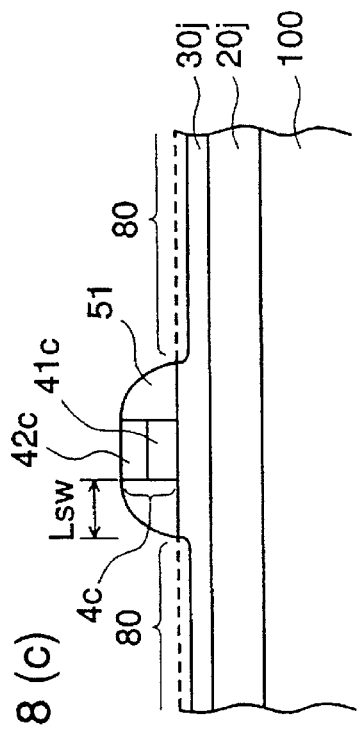

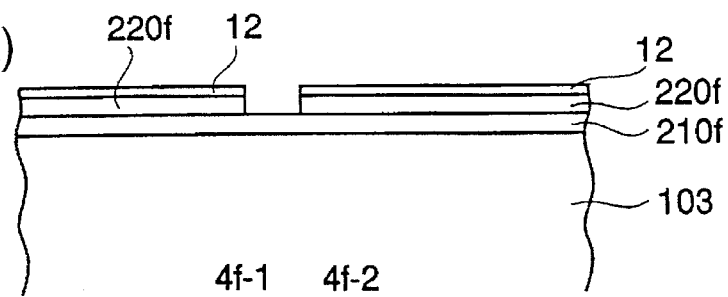
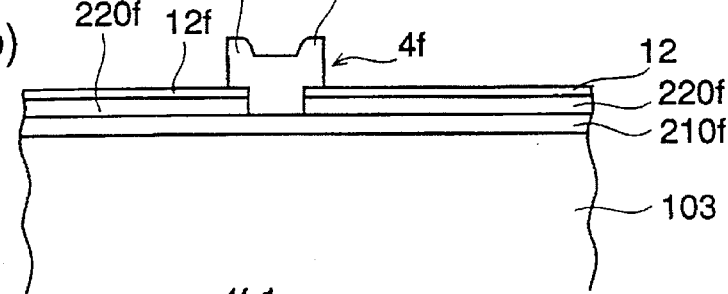
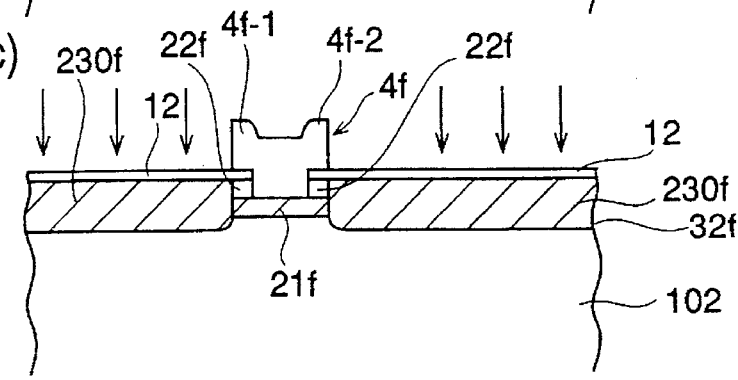
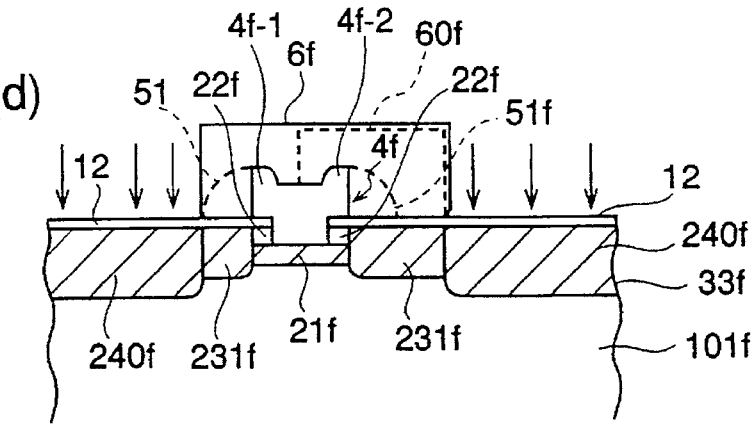
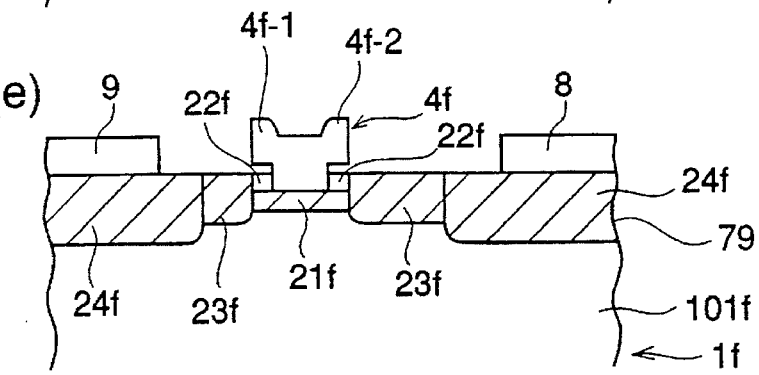

HIGH BREAKDOWN VOLTAGE FIELD EFFECT TRANSISTOR

FIELD OF THE INVENTION

The present invention relates to a semiconductor device and a method for fabricating a semiconductor device and, more particularly, to a high breakdown voltage field effect transistor or a switching element having a SAG (self aligned gate) structure employing a refractory metal electrode, a semiconductor device integrating these semiconductor elements, and a method of fabricating these devices.

BACKGROUND OF THE INVENTION

FIG. 19 is a diagram illustrating a prior art field effect transistor (referred to as an FET), having a SAG (self aligned gate) structure in which a gate electrode is offset toward the source. The FET includes a GaAs substrate 1j, an i-type GaAs layer 100 on the GaAs substrate 1j, a p type GaAs layer 2j on the GaAs substrate 1j, and an n type GaAs layer 74 on the GaAs semiconductor substrate 1j. The n type GaAs layer 74 has an n type GaAs region 3j and an n⁺ type GaAs region 7j. The donor concentration of the n type GaAs region 3j is about $2 \times 10^{17}/cm^3$, and the donor concentration of the n⁺ type GaAs region 7j is about $1 \times 10^{18}/cm^3$. The FET includes a gate electrode 4 comprising a refractory metal, for example, WSi, on the n type GaAs region 3j. The gate length of the gate electrode 4 is normally 0.5–1.0 µm. A drain electrode 8 is located on the drain side n⁺ type GaAs region 7j and a source electrode 9 is located on the source side n⁺ type GaAs region 7j. The drain electrode 8 and the source electrode 9 are an Ni layer 20 nanometers (nm) thick on an AuGe layer 50 nm thick and an Au layer 250 nm thick on the Ni layer.

A description is given of a prior art method of fabricating the FET as shown in the cross-sectional views of FIGS. 20(a)–20(e). First, ions of Mg are implanted into the GaAs substrate with an accelerating voltage of 150 keV and a dosage of $3 \times 10^{12}/cm^2$, and an upper layer portion of the GaAs semiconductor substrate is changed to p type GaAs, thereby forming a p type GaAs layer. Next, Si ions are implanted into the p type GaAs layer at 70 kev and a dosage of $7 \times 10^{12}/cm^2$, changing the upper layer portion of the p type GaAs layer to n type GaAs, and forming an n type GaAs layer. After the successive Mg and Si implantations, the semiconductor substrate is annealed to activate the implanted layers. Thus, the n type GaAs layer 31j and the p type GaAs layer 20j on the GaAs layer 100 shown in FIG. 20(a) are formed.

Thereafter, on the entire surface of the n type GaAs layer 31j, a refractory metal film comprising WSi 400 nm thick is deposited by sputtering. Next, patterning of resist for forming a gate electrode is carried out and isotropic etching using the resist as a mask is performed by RIE or ECR, thereby forming the gate electrode 4 shown in FIG. 20(a).

After forming the gate electrode 4, in the step of FIG. 20(b), an insulating film 5 is formed by plasma CVD on the n type GaAs layer 31j and the gate electrode 4. The thickness t of the film 5 is 0.4 µm.

After forming the insulating film 5, in the step of FIG. 20(c), isotropic ECR etching is carried out, leaving portions of the insulating film 5 at the side wall of the gate electrode 4 and forming the side wall 51. While etching the insulating film 5, the etching selectivity ratio between the n type GaAs layer 31j and the insulating film 5 cannot be made large, resulting in removing a portion of the surface of the n type GaAs layer 31j together with the insulating film 5. Thereby, an n type GaAs layer 30j having an etched portion 80 is formed. The depth of the etched portion 80 is generally about 50 nm. In addition, the width $L_{SW}$ of the sidewall has a relation with the thickness t of the insulating film 5 shown in FIG. 20(b), $$L_{SW} = 2/3 \cdot t.$$

The width $L_{SW}$ of this sidewall 51 influences the transistor characteristics and it is possible to control the sidewall width $L_{SW}$ by controlling the thickness t, thereby adjusting the transistor characteristics. In this example, since the thickness t is 0.4 µm, $L_{SW}$ is about 0.27 µm.

After forming the sidewall 51, photoresist 6 is formed with an offset at the side of the drain electrode 8 that is formed later as shown in FIG. 20(d). The resist 6 has an offset of 1 µm from the end of the gate electrode 4. Using the gate electrode 4, the sidewall 51, and the photoresist 6 as a mask, Si ions are implanted into the GaAs semiconductor substrate at 100 keV and a dosage of $3 \times 10^{13}/cm^2$. Thereby, the n type GaAs region 3j and the n⁺ GaAs region 70j are formed, and, as shown in FIG. 20(d), an n type GaAs layer 32j, including the n type GaAs region 3j and the n⁺ type GaAs region 70j, is formed on the p type GaAs layer 2j that is produced by changing the p type GaAs layer 20j.

The sidewall 51 and the photoresist 6 are removed and the n⁺ type GaAs region 70j is activated by annealing, thereby forming an n⁺ type GaAs region 7j shown in FIG. 20(e). As a result, a GaAs semiconductor substrate 1j including the n type GaAs layer 74 comprising the p type GaAs layer 2j, n type GaAs region 3j, and the n⁺ type GaAs region 7j is formed on the GaAs layer 100. As shown in FIG. 20(e), a drain electrode 8 and a source electrode 9 are formed by evaporation and liftoff, completing the FET.

The SAGFET having such a structure is mainly used for outputting high power. The DC characteristics of importance for a high power FET include drain breakdown voltage and gate-to-drain breakdown voltage ($V_{gdo}$). In order to increase these breakdown voltages, high dopant concentration regions are located at respective portions spaced from the gate electrode by using the sidewall 51 and the resist 6 as a mask. The interval between the gate electrode 4 and the drain electrode 8 is larger than the interval between the gate electrode 4 and the source electrode 9, producing an offset structure. The drain breakdown voltage and the gate-drain voltage ($V_{gdo}$) are increased by increasing the distance between the gate electrode 4 and the drain electrode 8, thereby realizing a high breakdown voltage.

A description is given of the operation of the prior art FET with reference to FIG. 21 showing an enlarged cross-section in the vicinity of the gate electrode 4. When a negative voltage is applied to the gate electrode 4 in order to control the drain current, a gate depletion layer is generated in the n type GaAs region 3j beneath the gate electrode 4 in accordance with the magnitude of the voltage. For example, when a negative voltage 90a is applied to the gate electrode 4, a gate depletion layer as shown by the line 90 in FIG. 21 is formed. The thickness of the channel beneath the gate electrode 4 is narrowed by the depth of the gate depletion layer, and the drain current $I_D$ flowing toward the source electrode 9 can be controlled in accordance with the applied voltage by controlling the thickness of the channel.

The line 91 in FIG. 21 represents a gate depletion layer that is generated when a negative voltage 91a closer to 0 V than the negative voltage 90a is applied to the gate electrode 4, and the line 92 represents a gate depletion layer that is generated when a negative voltage 92a closer to 0 V than the negative voltage 91a is applied to the gate electrode 4.

Further, the line 93 represents the surface depletion layer of the GaAs semiconductor substrate 1j.

FIG. 23 is a cross-sectional view of a prior art semiconductor switching element with a high breakdown voltage. The switching element includes a semiconductor substrate 100 comprising GaAs, an n type semiconductor layer 30r formed on the semiconductor substrate 100 by molecular beam epitaxy (MBE) or ion implantation, a recess 3r formed by engraving the n type semiconductor layer 30r, a gate electrode 40 located in the recess 3r, a drain electrode 8, and a source electrode 9.

The switching element is mainly used as a high power switch. When switching between transmission and reception, the switching element must sufficiently turn off the transmission output. Particularly when a signal of high output is dealt with, it is required that the gate-to-source breakdown voltage ($V_{gso}$) and the gate-to-drain breakdown voltage ($V_{gdo}$) be quite high. Generally, a high breakdown voltage switching element can achieve a high gate-to-source breakdown voltage ($V_{gso}$) and a high gate-to-drain breakdown voltage ($V_{gdo}$) by adopting the recess structure as shown in FIG. 23.

The prior art FET semiconductor device is fabricated as described above, and when the sidewalls 51 are formed, the surface of the n type GaAs layer 31j is engraved as shown in FIG. 20(c). However, there is a problem in the transconductance ($g_m$) of the FET. When the voltage applied to the gate electrode 4 is closer to 0 V than the negative voltage 91a, relative to the thickness of the channel which is narrowed by the gate depletion layer as shown by the line 92 in FIG. 21, the channel narrowed by the surface depletion layer below the engraved part 80 becomes thinner. Therefore, in the prior art FET, if the voltage applied to the gate electrode 4 is closer to 0 V than the negative voltage 91a, channel confinement arises due to the surface depletion layer beneath the engraved part 80. As a result, as shown in FIG. 22(a), the transconductance of the prior art FET is significantly reduced when the gate voltage is reduced from the negative voltage 91a toward the 0 V direction, and a good value is not obtained in the vicinity of 0 V. In other words, in the prior art FET, even when the gate voltage is made closer to 0 V at equal intervals from the minus side to 0 V, the drain current $I_D$ does not increase at equal intervals, as shown in FIG. 22(b).

In addition, when a further increase of the breakdown voltage is required and the voltage applied to the gate electrode is increased, a leakage current from the gate electrode to the high concentration layer is likely to flow.

In the prior art switching element using a recess structure as shown in FIG. 23, the breakdown voltage is controlled by the engraving depth of the n type semiconductor layer 30r. Broadening of the recess 3r in the transverse direction increases the breakdown voltage. However, variations among respective elements in a wafer surface upon forming the recess and variations in lots of wafers are large, so the yield is low. In addition, it is difficult to fabricate such a high breakdown switching element as a planar element. When a high breakdown voltage and monolithic microwave integrated circuit (MMIC) that includes such a switching element and an element including the FET element are fabricated, the fundamental structural difference between planar type devices and recess type devices makes the fabrication process difficult and no improvement in yield is achieved.

SUMMARY OF THE INVENTION

It is an object of the present invention to provide a high breakdown voltage planar type semiconductor device and a method of fabricating the semiconductor device that can achieve a high transconductance even in the vicinity of a gate voltage of 0 V.

It is another object of the present invention to provide a semiconductor device and a method of fabricating the semiconductor device that can relax channel confinement due to engraving even when engraving of the GaAs semiconductor substrate occurs when forming the sidewall.

It is a still another object of the present invention to provide semiconductor device and a method of fabricating the semiconductor device in which a GaAs semiconductor substrate is not etched upon forming a mask for ion implantation to form an intermediately doped layer.

It is another object of the present invention to provide a semiconductor device and a method of fabricating the semiconductor device with increased breakdown voltage.

It is yet another object of the present invention to provide a semiconductor device and a method of fabricating the semiconductor device as a high breakdown voltage planar type switching element in place of a recess type, and further, to simplify wafer processing and increase yield by forming an MMIC including these semiconductor devices.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a semiconductor device including a drain electrode, a source electrode, and a gate electrode on a semiconductor substrate comprises a semiconductor layer formed on a surface region of the semiconductor substrate, the semiconductor layer including:

a first region including dopant impurities selected from donors and acceptors in a first concentration and having a central portion at an upper surface on which a gate electrode is to be disposed;

a second region including dopant impurities producing the same conductivity type as the first region in a second concentration, larger than the first concentration, and disposed adjacent to the first region at the drain side end of the first region, having a second length toward the drain side;

a drain side third region including dopant impurities producing the same conductivity type as the first region in a third concentration, larger than the second concentration, and disposed adjacent to the second region at the drain side end of the second region;

a source side third region including dopant impurities producing the same conductivity type as the first region in a third concentration, larger than the second concentration, and disposed adjacent to the first region at the source side end of the first region; and a gate electrode disposed on a portion of the first region on which the gate electrode is to be disposed, a drain electrode disposed on a portion of the drain side third region, and a source electrode disposed on a portion of the source side third region.

Even when the second region is engraved while producing the sidewall, the depth of the surface depletion layer of the engraved part is shallow, whereby channel confinement due to the surface depletion layer is relaxed. In addition, even when the electric field is concentrated at the drain side of the first region by the gate voltage and the drain voltage, the electric field concentration at the third region is relaxed since the second region is located at the drain side of the first region.

According to a second aspect of the present invention, a semiconductor device including a drain electrode, a source electrode, and a gate electrode on a semiconductor substrate comprises a semiconductor layer at a surface region of the semiconductor substrate, the semiconductor layer including:

- a first region including dopant impurities selected from donors and acceptors in a first concentration and having a central portion at an upper surface on which a gate electrode having a first length is to be disposed;
- a drain side second region including dopant impurities producing the same conductivity type as the first region in a second concentration, larger than the first concentration, and disposed adjacent to the first region at the drain side end of the first region, having a second length toward the drain side;
- a source side second region including dopant impurities producing the same conductivity type as the first region, in the second concentration, and disposed adjacent to the first region at the source side end of the first region, having a third length toward the source side;
- a drain side third region including dopant impurities producing the same conductivity type as the first region, in a third concentration larger than the drain side second region, and disposed adjacent to the drain side second region at the drain side end of the second region;
- a source side third region including dopant impurities producing the same conductivity type as the first region, in the a third concentration, and disposed adjacent to the source side second region at the source side end of the source side second region; and
- a gate electrode disposed on a portion of the first region, a drain electrode disposed on a portion of the drain side third region, and a source electrode disposed on a portion of the source side third region.

Therefore, even when the second region is engraved while producing the sidewall, the depth of the surface depletion layer of the engraved part is shallow, whereby channel confinement due to the surface depletion layer is relaxed. In addition, since there is further provided the second region at the source side of the first region, the gate source breakdown voltage is increased and leakage current is suppressed.

According to a third aspect of the present invention, in the semiconductor device, the gate electrode has first and second projecting portions at the source side and drain side surfaces, respectively, projecting toward the source and drain sides, respectively, not in contact with the semiconductor layer. A source side end of the first projecting portion is positioned above the source side end of the first region and a drain side end of the second projecting portion is positioned above the drain side end of the first region. Therefore, the first region and the second region can be formed without engraving, and, thus, channel confinement due to the surface depletion layer and engraving is relaxed. In addition, the electric field concentration at the third region is relaxed, and leakage current is suppressed.

According to a fourth aspect of the present invention, in the semiconductor device, a semiconductor layer positioned below the first, second, and third regions includes dopant impurities that produce a different conductivity type from the first, second, and third regions. Therefore, the gradient of the carrier concentration distribution curve in the depth direction of the channel can be steep, whereby the uniformity of the respective semiconductor elements on the wafer surface is improved.

According to a fifth aspect of the present invention, in the semiconductor device, a semiconductor layer positioned below the first, second, and third regions is intrinsic, and intrinsic semiconductor regions are located at the first region, positioned under the first and second projecting portions of the gate electrode. Therefore, in addition to forming the first and second regions without engraving, channel confinement due to the surface depletion layer and the engraved part is relaxed, and no surface depletion layer is produced at the first region beneath the intrinsic semiconductor layer, whereby channel confinement is further relaxed. In addition, the electric field concentration at the third region is relaxed, and leakage current is suppressed.

According to a sixth aspect of the present invention, in the semiconductor device, the gate electrode is disposed between the drain electrode and the source electrode, closer to the source electrode than to the drain electrode, and the second length of the drain side second region is longer than the third length of the source side second region. Therefore, even when the electric field is concentrated at the drain side of the first region by the gate voltage and the drain, the electric field concentration at the drain side third region is relaxed.

According to a seventh aspect of the present invention, in the semiconductor device, the gate electrode is disposed between and equally distant from the source electrode and the drain electrode and the second length of the drain side second region is equal to the third length of the source side second region. Therefore, a planar type high breakdown voltage switching element is realized.

According to an eighth aspect of the present invention, the semiconductor device further comprises one or a plurality of unit semiconductor devices, in each of which the gate electrode is disposed between the drain electrode and the source electrode, closer to the source electrode than to the drain electrode, and one or a plurality of unit semiconductor devices, in each of which the gate electrode is equally distant from the source electrode and from the drain electrode, integrated with each other. Therefore, a planar type high breakdown voltage integrated circuit device is realized.

According to a ninth aspect of the present invention, a method of fabricating a semiconductor device including a drain electrode, a source electrode, and a gate electrode on a semiconductor substrate comprises forming a gate electrode on a semiconductor layer having a conductivity type at a surface region of the semiconductor substrate; forming an insulating film on surfaces of the gate electrode and the semiconductor layer and removing unrequired portions of the insulating film by etching to form sidewalls at the side of the gate electrode; implanting dopant impurities producing the same conductivity type as the semiconductor layer into the semiconductor substrate using the gate electrode and the sidewalls as a mask; forming resist on the semiconductor substrate covering from a position on the first mask to a position a first distance from the drain side end of the gate electrode toward the drain side; implanting dopant impurities producing the same conductivity type as the semiconductor layer into the semiconductor layer using the resist and the first mask as a second mask; forming a source electrode on the semiconductor substrate at a position spaced from the second mask toward the source side and a drain electrode on the semiconductor substrate at a position spaced from the second mask toward the drain side.

Therefore, the region of the semiconductor layer below the first mask includes dopant impurities in a required concentration, a region other than below the first mask of the semiconductor layer, below the second mask, can include dopant impurities in a concentration larger than the required concentration, and the region of the semiconductor layer other than below the second mask includes dopant impurities in a concentration larger than the respective concentrations.

According to a tenth aspect of the present invention, a method of fabricating a semiconductor device including a drain electrode, a source electrode, and a gate electrode on a semiconductor substrate comprises:

forming a first metal film on a semiconductor layer having a conductivity type and disposed on a surface region of the semiconductor substrate, forming a second metal film on the first metal film, and then removing the second metal film to leave a required region of the second metal film serving as a part of the gate electrode, thereby forming a portion of the gate electrode;

forming an insulating film on a portion of the gate electrode and the first metal film, removing an unrequired portion of the insulating film by etching to form sidewalls at a portion of the side of the gate electrode;

implanting dopant impurities producing the same conductivity type as the semiconductor layer into the semiconductor substrate using a portion of the gate electrode and the sidewalls as a first mask and the first metal film as a through film that the implanted impurities pass through;

forming resist on the semiconductor substrate covering from a position on the first mask to a position a first distance from the drain side end of the portion of the gate electrode toward the drain side;

implanting dopant impurities producing the same conductivity type as the semiconductor layer into the semiconductor substrate using the resist and the first mask as a second mask and the first metal film as a through film;

after removing the resist and the sidewalls, partly removing the first metal film to leave a required region of the first metal film serving as the gate electrode, thereby forming another portion of the gate electrode; and forming the source electrode on the semiconductor substrate at a position spaced from the second mask toward the source side and the drain electrode on the semiconductor substrate at a position spaced from the second mask toward the drain side.

Even when the sidewall constituting the first mask is formed, the semiconductor substrate is not engraved. In addition, the region of the semiconductor layer below the first mask can include the dopant impurities in a required concentration, the region other than below the first mask of the semiconductor layer below the resist can include the dopant impurities in a concentration larger than the required concentration, and the region of the semiconductor layer other than below the second mask can include the dopant impurities in a concentration larger than the respective concentrations.

According to an eleventh aspect of the present invention, in the method of fabricating a semiconductor device, the process of forming resist comprises forming resist on the semiconductor substrate covering from a position a first distance from the drain side end of the region where the gate electrode is to be formed toward the drain side to a position a second distance from the source side end of the region wherein the gate electrode is to be formed toward the source side.

Therefore, the region of the semiconductor layer below the first mask can include the dopant impurities in a required concentration, and because of the second mask of the semiconductor layer, a region including the dopant impurities in a concentration larger than the required concentration can be provided at the source side of the gate electrode, and a region of the semiconductor layer, other than below the second mask, can include the dopant impurities in a concentration larger than the respective concentrations.

According to a twelfth aspect of the present invention, a method of fabricating a semiconductor device having a gate electrode, a source electrode, and a drain electrode on a semiconductor substrate comprises:

forming the gate electrode on a semiconductor layer having a conductivity type at a surface region of the semiconductor substrate;

forming an insulating film on surfaces of the gate electrode and semiconductor layer, forming resist on the insulating film covering from a portion a first distance from the drain side end of the gate electrode toward the drain side to a portion a second distance from the source side end of the gate electrode toward the source side, and removing the insulating film by etching to leave a portion of the insulating film positioned under the resist;

implanting dopant impurities producing the same conductivity type as the semiconductor layer into the semiconductor substrate using the gate electrode, the insulating film, and the resist as a mask;

after removing the resist, implanting dopant impurities producing the same conductivity type as the semiconductor layer into the semiconductor substrate using the gate electrode and portions of the insulating film at the sides of the gate electrode as a mask and employing portions of the insulating film on the surface of the semiconductor layer as through films that the implanted dopant impurities pass through; and forming the source electrode on a portion of the surface of the semiconductor substrate spaced from the insulating film toward the source side and the drain electrode on a portion of the surface of the semiconductor substrate spaced from the insulating film toward drain side.

Because the substrate does not include the engraved part and the gate electrode and the insulating film at the side surface portion of the gate electrode are used as a mask, the region of the semiconductor layer below the mask can include the dopant impurities in a required concentration, and, further, by making the insulating film a semitransparent film, the region of the semiconductor layer below the insulating film, other than below the mask, can include dopant impurities in a concentration larger than the required concentration, and the region of the semiconductor layer other than below the insulating film can include the impurities in a concentration larger than the respective concentrations.

According to a thirteenth aspect of the present invention, a method of fabricating a semiconductor device having a gate electrode, a source electrode, and a drain electrode on a semiconductor substrate comprises:

forming a semiconductor layer having a conductivity type at a surface region of the semiconductor substrate;

forming an insulating film at a region on the surface of the semiconductor layer other than a region where the gate electrode is to be attached;

depositing an electrode material on the region where the gate electrode is to be attached and on the ends of the insulating film adjacent to the gate electrode attaching region at the source side and the drain side, respectively, to form a gate electrode having projecting portions projecting toward the source side and the drain side, respectively;

implanting dopant impurities producing the same conductivity type as the semiconductor layer into the semiconductor substrate using the gate electrode as a first mask and the insulating film as a through film that the implanted dopant impurities pass through;

forming resist on the semiconductor substrate covering from a portion a first distance from the gate electrode attaching region toward the drain side to a portion a second distance from the source side end of the gate electrode attaching region toward the source side;

implanting dopant impurities producing the same conductivity type as the semiconductor layer into the semiconductor substrate using the resist and the gate electrode as a second mask and the insulating film as a through film;

forming the source electrode on a portion of the surface of the semiconductor substrate spaced from the second mask toward the source side and the drain electrode on a portion of the surface of the semiconductor substrate spaced from the second mask toward the drain side.

Therefore, without engraving the semiconductor substrate, the region of the semiconductor layer below the gate electrode can include the dopant impurities in a required concentration, the region of the semiconductor layer below the second mask, other than below the gate electrode, can include dopant impurities in a concentration larger than the required concentration, and the region of the semiconductor layer other than below the second mask can include dopant impurities in a concentration larger than the other concentrations.

According to a fourteenth aspect of the present invention a method of fabricating a semiconductor device having a gate electrode, a source electrode, and a drain electrode on a semiconductor substrate comprises:

forming a semiconductor layer having a conductivity type at a surface region of the semiconductor substrate;

forming a first insulating film at a region on the surface of the semiconductor layer other than a region where the gate electrode is to be formed;

depositing an electrode material where the gate electrode is to be formed and on the ends of the first insulating film adjacent to the gate electrode region at the source side and the drain side, respectively, to form a gate electrode having projecting portions projecting toward the source and drain sides, respectively;

implanting dopant impurities producing the same conductivity type as the semiconductor layer into the semiconductor substrate using the gate electrode as a first mask and the insulating film as a through film that the implanted impurities pass through;

forming a second insulating film on the gate electrode and on a portion of the first insulating film and etching and removing an unrequired portion of the second insulating film to form side walls at the sides of the gate electrode;

forming resist on a portion on the semiconductor substrate covering from a position on the gate electrode or on the sidewall to a position a distance from the drain side end of the gate electrode region toward the drain side;

implanting dopant impurities producing the same conductivity type as the semiconductor layer into the semiconductor substrate using the resist, the sidewall, and the gate electrode as a second mask and the first insulating film as a through film; and forming the source electrode on a portion of the surface of the semiconductor substrate spaced from the second mask toward the source side and the drain electrode on a portion of the surface of the semiconductor substrate spaced from the second mask toward the drain side.

Even when the sidewall is formed at the gate electrode, the surface of the semiconductor substrate is not engraved. In addition, the region of the semiconductor layer below the gate electrode can include dopant impurities in a required concentration, the region of the semiconductor layer below the second mask, and other than below the gate electrode can include dopant impurities in a concentration larger than the required concentration, and the region of the semiconductor layer other than below the second mask can include dopant impurities in a concentration larger than the respective concentrations.

According to a fifteenth aspect of the present invention, a method of fabricating a semiconductor device having a gate electrode, a source electrode, and a drain electrode on a semiconductor substrate comprises:

forming a semiconductor layer having a conductivity type at a surface region of the semiconductor substrate;

forming an insulating film on a source side and an insulating film on a drain side, respectively, on a region from the drain side end of a gate electrode region to a position a first distance therefrom and on a region from the source side end of the gate electrode region to a portion a second distance therefrom on the semiconductor layer;

depositing an electrode material on the gate electrode region and on the ends of the insulating film adjacent to the gate electrode region at the source and drain sides, respectively, to form a gate electrode having projecting portions projecting toward the source and drain sides, respectively;

implanting dopant impurities producing the same conductivity type as the semiconductor layer into the semiconductor substrate using the gate electrode as a mask and the insulating film as the source side and the insulating film at the drain side as through films that the implanted dopant impurities pass through; and forming the source electrode on a portion of the surface of the semiconductor substrate spaced from the mask toward the source side and the drain electrode on a portion of the surface of the semiconductor substrate spaced from the mask toward the drain side.

Therefore, without engraving the semiconductor substrate, the region of the semiconductor layer below the gate electrode can include dopant impurities in a required concentration, the region of the semiconductor layer below the insulating film, other than below the gate electrode, can include dopant impurities in a concentration larger than the required concentration, and the region of the semiconductor layer other than below the gate electrode and the insulating film can include dopant impurities in a concentration larger than the other respective concentrations. Further, the process of ion implantation can be simplified.

According to a sixteenth aspect of the present invention, a method of fabricating a semiconductor device having a gate electrode, a source electrode, and a drain electrode on a semiconductor substrate comprises:

forming a semiconductor substrate to include, successively, a first semiconductor layer as an intrinsic semiconductor layer, a second semiconductor layer having a conductivity type, and a third semiconductor layer as an intrinsic semiconductor layer;

forming an insulating film on the third semiconductor layer;

removing the insulating film and the third semiconductor layer on the region at the second semiconductor layer where a gate electrode is to be formed, exposing a gate electrode region of the second semiconductor layer;

depositing an electrode material on the gate electrode region and on both ends of the insulating film respectively adjacent to the gate electrode region at the drain and source sides, thereby forming a gate electrode having projections projecting toward the drain and source sides, respectively;

implanting dopant impurities producing the same conductivity type as the second semiconductor layer into the second and third semiconductor layers using the gate electrode as a first mask and the insulating film as a through film that the implanted dopant impurities pass through;

forming resist on the semiconductor substrate covering from a position a first distance from the drain side end of the gate electrode region toward the drain side to a position a second distance from the source side end of the gate electrode region toward the source side;

implanting dopant impurities producing the same conductivity type as the second semiconductor layer into the second and third semiconductor layers using the resist and the gate electrode as a second mask and the insulating film as a through film; and forming the source electrode on a portion of the surface of the semiconductor substrate spaced from the second mask toward the source side and the drain electrode on a portion of the surface of the semiconductor substrate spaced from the second mask toward the drain side.

Therefore, the region of the third semiconductor layer below the gate electrode can be held as an intrinsic semiconductor, the region of the second semiconductor layer below the gate electrode can include dopant impurities in a required concentration, the regions of the third and the second semiconductor layers below the second mask, other than below the gate electrode, can include dopant impurities in a concentration larger than the required concentration, and the regions of the third and the second semiconductor layers, other than below the second mask, can include dopant impurities in a concentration larger than the respective concentrations. In addition, since no sidewall is formed, the semiconductor substrate is not engraved.

According to a seventeenth aspect of the present invention, a method of fabricating a semiconductor device having a gate electrode, a source electrode, and a drain electrode on a semiconductor substrate comprises:

forming a semiconductor substrate having successively a first semiconductor layer as an intrinsic semiconductor layer, a second semiconductor layer having a conductivity type, and a third semiconductor layer as an intrinsic semiconductor layer;

forming a first insulating film on the third semiconductor layer;

removing the first insulating film and the third semiconductor layer on a region on the second semiconductor layer where a gate electrode is to be attached, exposing the gate electrode region of the second semiconductor layer;

depositing an electrode material on the gate electrode region and on both ends of the first insulating film respectively adjacent to the gate electrode attaching region at the drain and source sides, forming the gate electrode having projections projecting toward the drain side and the source side, respectively;

implanting dopant impurities producing the same conductivity type as the second semiconductor layer into the second and third semiconductor layers using the gate electrode as a first mask and the first insulating film as a through film that the dopant implanted impurities pass through;

forming a second insulating film on the gate electrode and on the first insulating film, removing an unrequired portion of the second insulating film by etching, forming sidewalls at the sides of the gate electrode;

forming resist on the semiconductor substrate covering from a position on the gate electrode or on the sidewall to a position spaced from the drain side end of the gate electrode region by a first distance toward the drain side;

implanting dopant impurities producing the same conductivity type as the second semiconductor layer into the second and third semiconductor layers using the resist, the sidewall, and the gate electrode as a second mask and the first insulating film as a through film; and forming the source electrode on a portion of the surface of the semiconductor substrate spaced from the second mask toward the source side and the drain electrode on a portion of the surface of the semiconductor substrate spaced from the second mask toward the drain side.

Therefore, even when the sidewall is formed at the gate electrode, the semiconductor substrate is not engraved. In addition, the region of the third semiconductor layer below the gate electrode can be held as an intrinsic semiconductor, the region of the second semiconductor layer below the gate electrode can include the dopant impurities in a required concentration, and the regions of the third and second semiconductor layers below the second mask can include dopant impurities in a concentration larger than the required concentration, and the regions of the third and second semiconductor layers, other than below the second mask, can include the dopant impurities in a concentration larger than the respective concentrations.

According to an eighteenth aspect of the present invention, in the method, the gate electrode is disposed at a position between the drain electrode and the source electrode, closer to the source electrode than to the drain electrode, and the length of the first distance of the resist or the insulating film from the drain side end of the gate electrode region is longer than the length of the second length of the resist or of the insulating film from the source side end of the gate electrode region. Therefore, a semiconductor device in which the electric field concentration at the drain side of the gate electrode can be relaxed is obtained.

According to a nineteenth aspect of the present invention, in the method, the gate electrode is disposed at a position between the drain electrode and the source electrode, which position is equally distant from the source electrode and from the drain electrode, and the length of the first distance of the resist or the insulating film from the drain side end of the gate electrode region is equal to the length of the second length of the resist or the insulating film from the source side end of the gate electrode region. Thereby, a high breakdown voltage planar type switching element is realized.

According to a twentieth aspect of the present invention, the method further includes:

at least one process for fabricating a unit semiconductor device in which the gate electrode is disposed at a position between the drain electrode and the source electrode, closer to the source electrode than to the drain electrode; and at least one process for fabricating a unit semiconductor device in which the gate electrode is disposed at a position between the drain electrode and the source electrode, which position is equally distant from the source electrode and from the drain electrode.

Thereby, a planar type high breakdown integrated circuit device can be fabricated.

BRIEF DESCRIPTION OF THE DRAWINGS

FIGS. 2(a)–2(f) are cross-sectional views illustrating a process of fabricating a semiconductor device according to a first embodiment of the present invention.

FIGS. 8(a)–8(f) are cross-sectional views illustrating processes for fabricating the semiconductor device of the third embodiment.

FIGS. 15(a)–15(e) are cross-sectional views illustrating processes for fabricating the semiconductor device of the sixth embodiment.

DETAILED DESCRIPTION OF THE PREFERRED EMBODIMENTS

Embodiment 1

Figure 1:
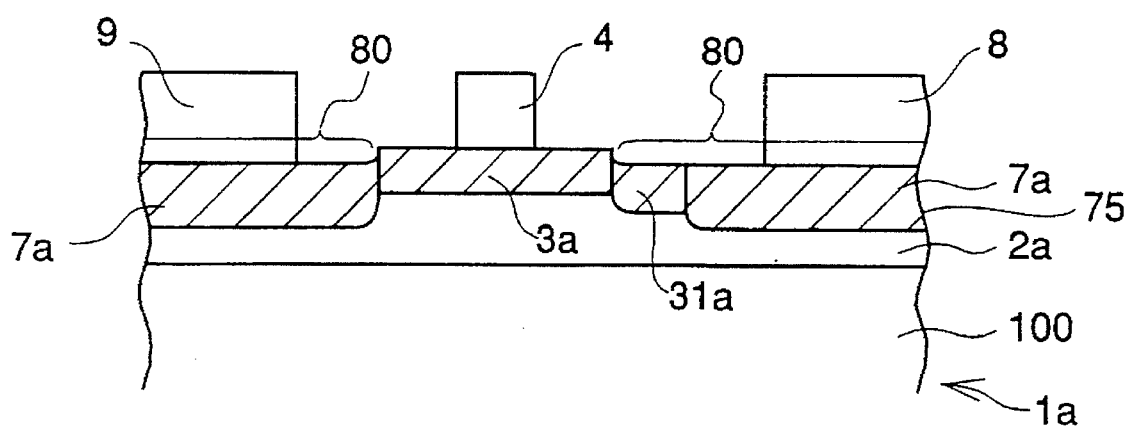
FIG. 1 is a cross-sectional view illustrating a semiconductor device according to a first embodiment of the present invention.
Figure 19:
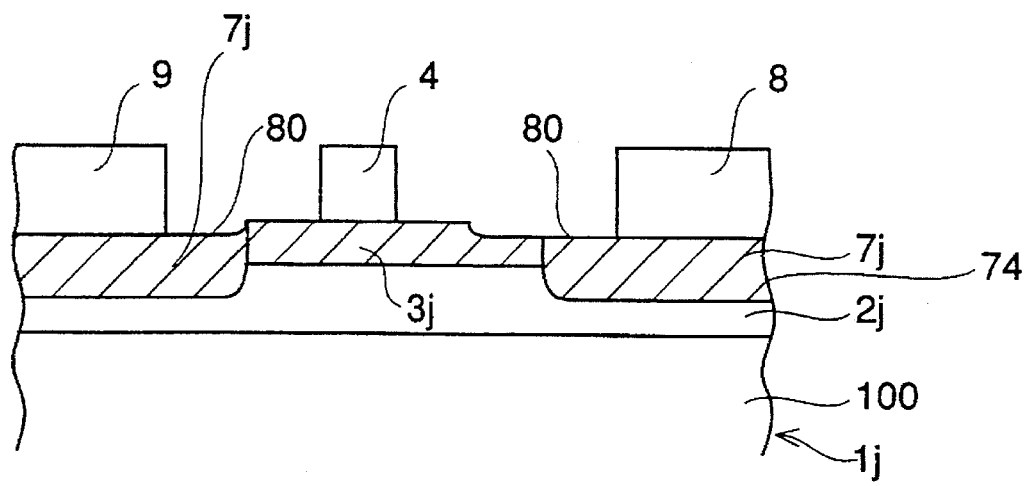
FIG. 19 is a cross-sectional view illustrating a prior art semiconductor device.

In the first embodiment as depicted in FIG. 1, the same reference numerals as in FIG. 19 designate the same or corresponding elements. Numeral 1a designates a GaAs substrate. Numeral 100 designates an i type GaAs layer on the GaAs semiconductor substrate 1a. Numeral 2a designates a p type GaAs layer on the GaAs semiconductor substrate 1a. An n type GaAs layer 75 is located on the GaAs semiconductor substrate 1a. This n type GaAs layer 75 comprises an n type GaAs region 3a, an intermediate dopant concentration n type (n' type) GaAs region 31a, and a high dopant concentration n type (n$^+$) GaAs region 7a. Here, the donor concentration of the n type GaAs region 3a is about $2 \times 10^{17}/\text{cm}^3$, and the donor concentration of the n' type GaAs region 7a is about $6 \times 10^{17}/\text{cm}^3$ and the donor concentration of the n$^+$ type GaAs region 7a is about $1 \times 10^{18}/\text{cm}^3$.

The n type GaAs layer 75 of the semiconductor device of this embodiment comprises the n type GaAs region 3a having a gate electrode region of a first length at approximately the center of the upper surface, the n' type GaAs region 31a adjacent thereto at the drain side end of the n type GaAs region 3a, and the drain n$^+$ type GaAs region 7a adjacent to the n' type GaAs region 31a at the drain side of the n' type GaAs region 31a, and the source n$^+$ type GaAs region 7a adjacent the n type GaAs region 3a at the source side end of the n type GaAs region 3a. Numeral 8 designates a drain electrode on the n$^+$ type GaAs region 7a at the drain side, numeral 9 designates a source electrode on the n$^+$ GaAs region 7a at the source side, and numeral 4 designates a gate electrode comprising a refractory metal such as WSi disposed on the n type GaAs region 3a. The gate length of the gate electrode 4 is generally 0.5 μm–1.0 μm, as required by the specification. In addition, numeral 80 designates an engraved, i.e., recessed, part in the GaAs substrate 1a and in the layer 2a.

The semiconductor device shown in FIG. 1 is an SAGFET having an offset gate construction with the gate electrode 4 at a position closer to the source electrode side than to the drain electrode side between the drain electrode 8 and the source electrode 9, and the n' type GaAs region 31a located at the drain side of the gate electrode.

In addition, the p type GaAs layer 2a provides a BPLDD (buried p-layer lightly doped drain) structure below the n type GaAs layer 75 because, when the p type layer is below the n type channel layer, a channel layer having a carrier concentration distribution changing steeply in the depth direction is obtained, providing improved switching characteristics and device uniformity.

Figure 20:
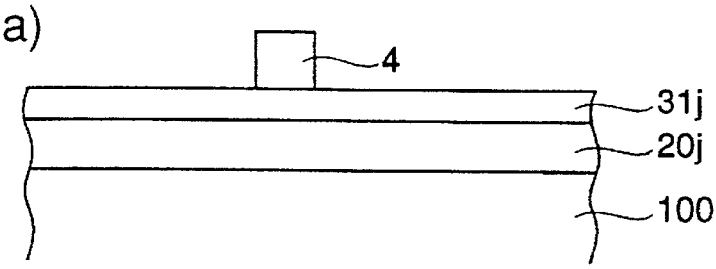
FIGS. 20(a)–20(e) are cross-sectional views illustrating processes for fabricating the prior art semiconductor device.
Figure 20:
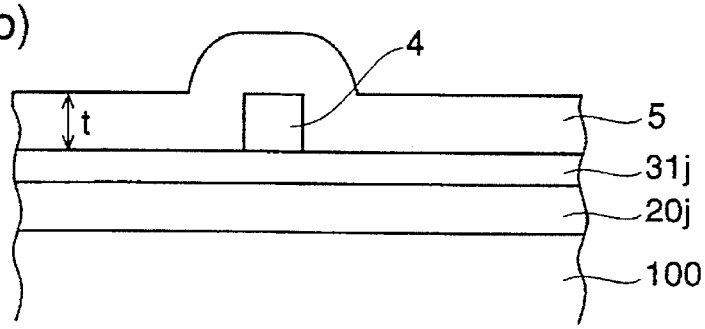
Figure 20:
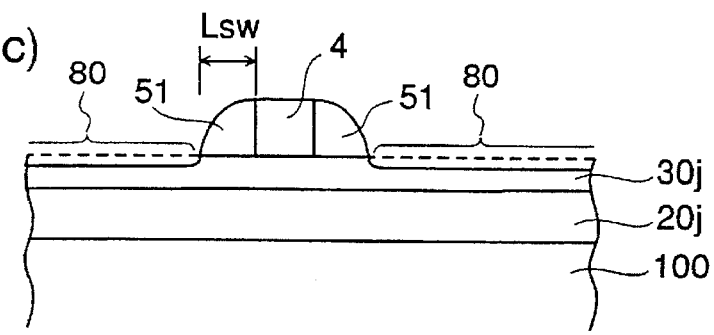
Figure 20:
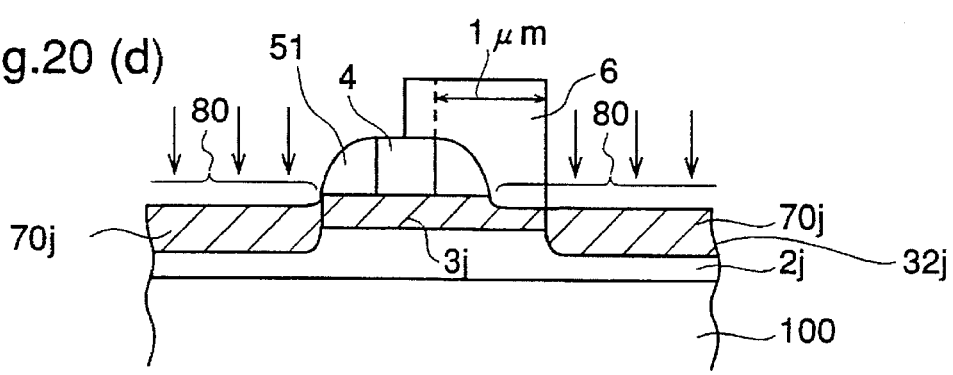
Figure 20:
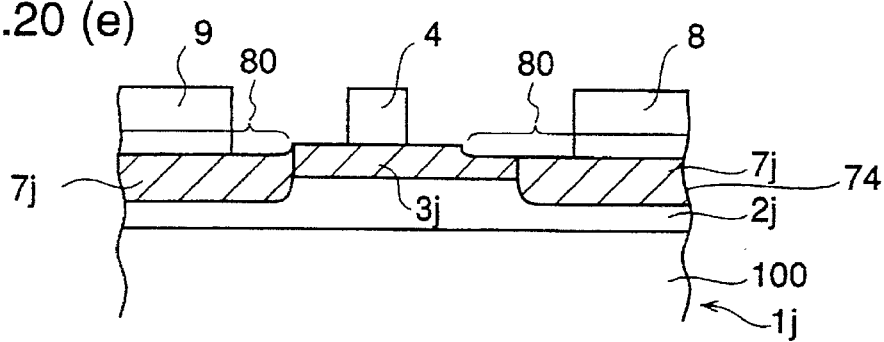

The cross-sectional views of FIGS. 2(a)–2(f) illustrate a method of fabricating a semiconductor device according to the first embodiment of the invention. As shown in FIGS. 2(a)–2(c), the gate electrode 4 and the sidewall 51 are formed on the GaAs semiconductor substrate by the prior art method depicted in FIGS. 20(a)–20(c).

As shown in FIG. 2(d), using the gate electrode 4 and the sidewall 51 as a mask, Si ions are implanted into the GaAs semiconductor substrate at 80 KeV and a dosage of $5 \times 10^{12}$/cm$^2$, whereby the n type GaAs region 3a and the n' type GaAs region 310a are formed, and thus the n type GaAs layer 32a comprising the n type GaAs region 3a and the n' type GaAs region 310a are formed in the p type GaAs layer 20a to which the p type GaAs layer 20j is changed.

As shown in FIG. 2(e), at a region from the gate electrode 4 to a position a predetermined distance from the drain side end of the gate electrode 4 toward the drain side, the photoresist 6 is an offset as in the prior art process. After the formation of the photoresist 6, using the gate electrode 4, the sidewall 51, and the photoresist 6 as masks, Si ions are implanted into the GaAs semiconductor substrate at 100 KeV and $3 \times 10^{13}$/cm$^2$. Thereby, the n type GaAs layer 33a comprising the n type GaAs region 3a, the n' type GaAs region 31a, and the n$^+$ type GaAs regions 70a are formed in the p type GaAs layer 2a to which the p type GaAs layer 20a is changed.

After removing the photoresist 6 and the sidewall 51, the n' type GaAs region 31a and the n$^+$ type GaAs region 70a are activated by annealing. Thereby, the n type GaAs region 75 comprising the n type GaAs region 3a, the n type GaAs region 31a, and the n$^+$ type GaAs regions 7a are formed. In other words, the semiconductor substrate 1a having the p type GaAs layer 2a and the n type GaAs layer 75 on the i type GaAs layer 100 is formed.

As shown in FIG. 2(f), a source electrode 9 and a drain electrode 8 both comprising AuGe/Ni/Au and having ohmic properties are formed by evaporation and lift-off at respective positions on the source side and drain side of the n$^+$ type semiconductor region 7a, thereby completing the FET.

Figure 3:
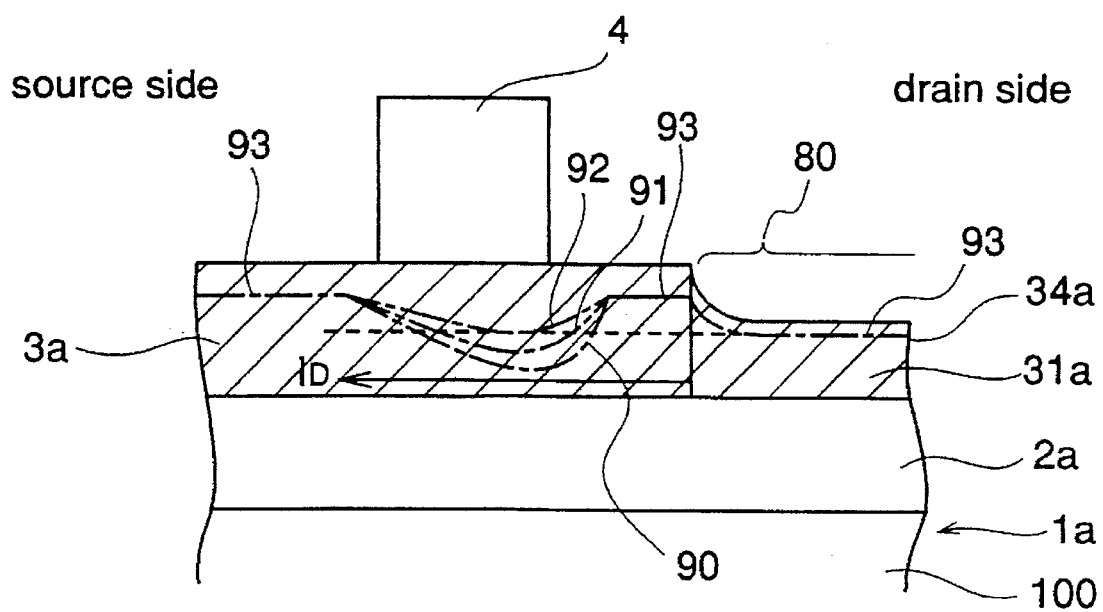
FIG. 3 is a cross-sectional view for explaining the operation of the semiconductor device of the first embodiment.
Figure 21:
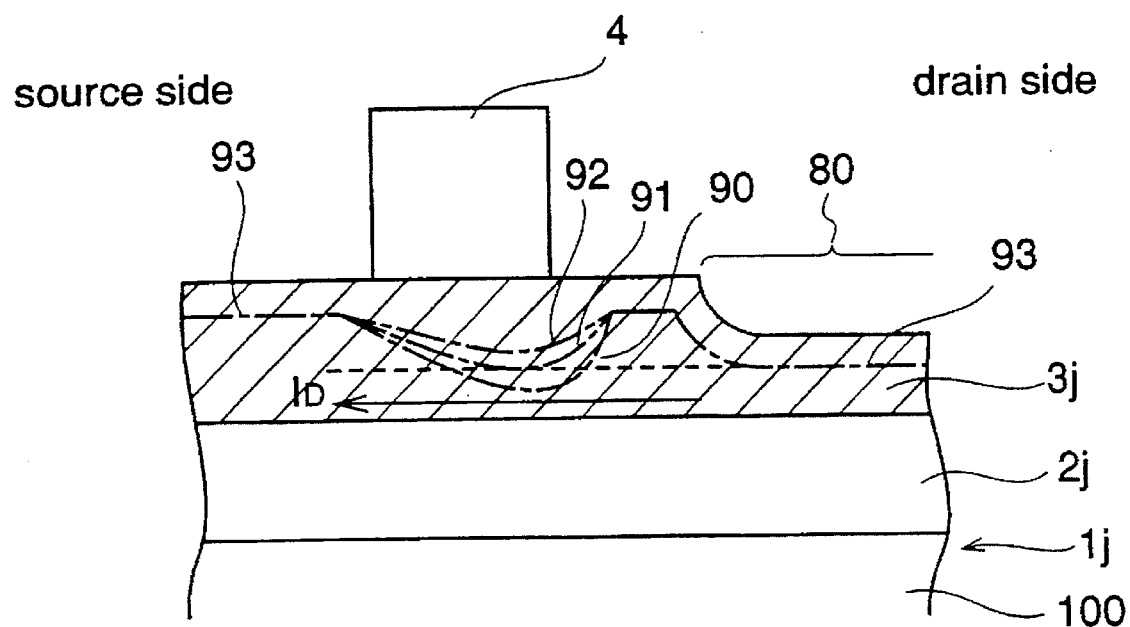
FIG. 21 is a cross-sectional view for explaining the operation of the prior art semiconductor device.

The operation and function of the FET of the first embodiment are described with reference to FIG. 3, an enlarged cross-sectional view illustrating the vicinity of the gate electrode 4. In FIG. 3, the same reference numerals as those in FIGS. 1 and 21 are used to designate the same or corresponding elements.

When a negative voltage is applied to the gate electrode 4, as in the prior art, a gate depletion layer having a depth according to the applied voltage is broadened to the n type GaAs region 3a below the gate electrode 4. For example, when a negative voltage 90a is applied to the gate electrode 4, a gate depletion layer as shown by a line 90 of FIG. 3 is formed. Since the depletion layer is broadened as described above, the channel below the gate electrode 4 becomes thinner, and, according to the magnitude of the applied voltage, the drain current $I_D$ flowing to the side of the source electrode 9 can be controlled. Here, the line 91 shown in FIG. 3 shows the gate depletion layer when a negative voltage 91a that is closer to 0 V than a negative voltage 90a is applied to the gate electrode 4, line 92 shows a gate depletion layer when a negative voltage 92a that is closer to 0 V than a negative voltage 91a is applied to the gate electrode 4, and the line 93 represents the depletion layer at the surface of the GaAs semiconductor substrate 1a.

The surface depletion layer and the gate depletion layer in this n type GaAs region 3a have the same depth as the n type GaAs region 3j of the prior art FET. However, the depth of the surface depletion layer generated below the engraved part 80 is, as shown by the line 93 in FIG. 3, shallower than the surface depletion layer of the n type GaAs region 3j of the prior art device in the n' type GaAs region 31a because the donor concentration of the n' type GaAs region 31a is larger than that of the n type GaAs region 3j of the prior art device.

In the prior art FET, when the voltage applied to the gate electrode 4 is closer to zero voltage than the negative voltage 91a, the thickness of the channel below the surface depletion layer of the n type GaAs region 3j is thinner than the channel below the gate depletion layer. The channel thickness is confined due to the surface depletion layer of the n type GaAs region 3j. However, in the FET of this first embodiment, up to the voltage 92 closer to 0 V than the negative voltage 91a shown in FIG. 3, the FET is not affected by channel confinement due to the surface depletion layer of the n' type GaAs region 31a.

Figure 4:
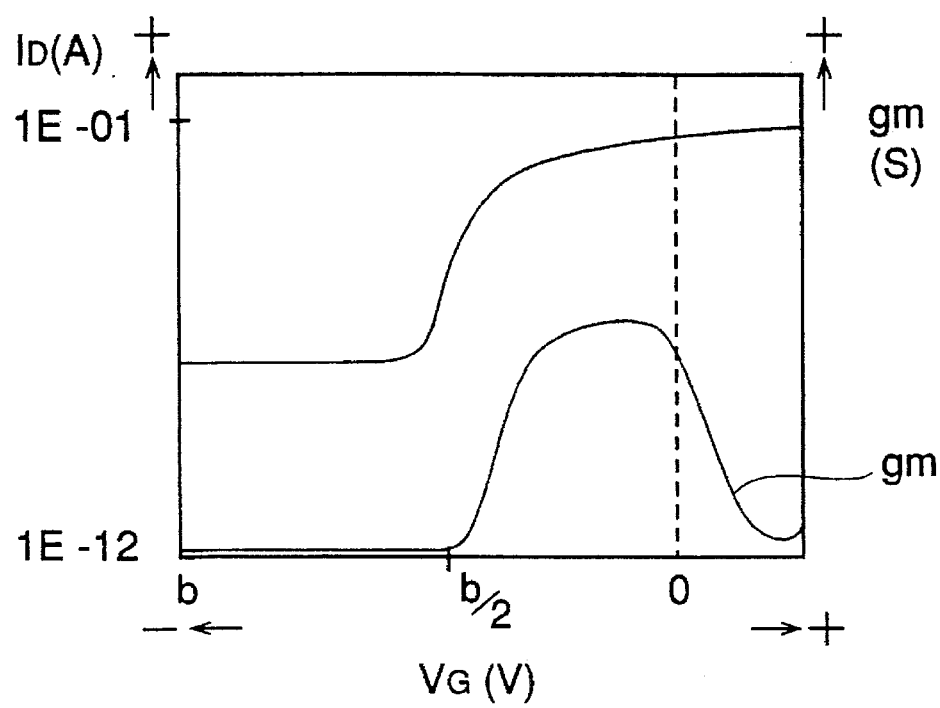
FIGS. 4(a) and 4(b) are diagrams showing the transconductance and the drain current, respectively, of the semiconductor device of the first embodiment.
Figure 4:
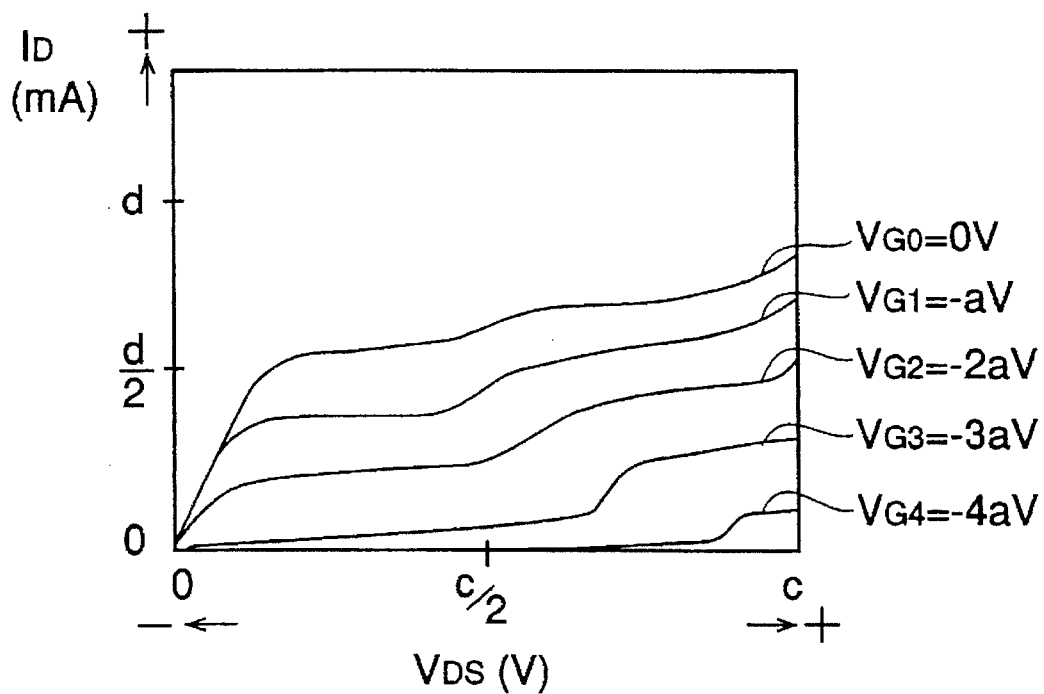
Figure 22:
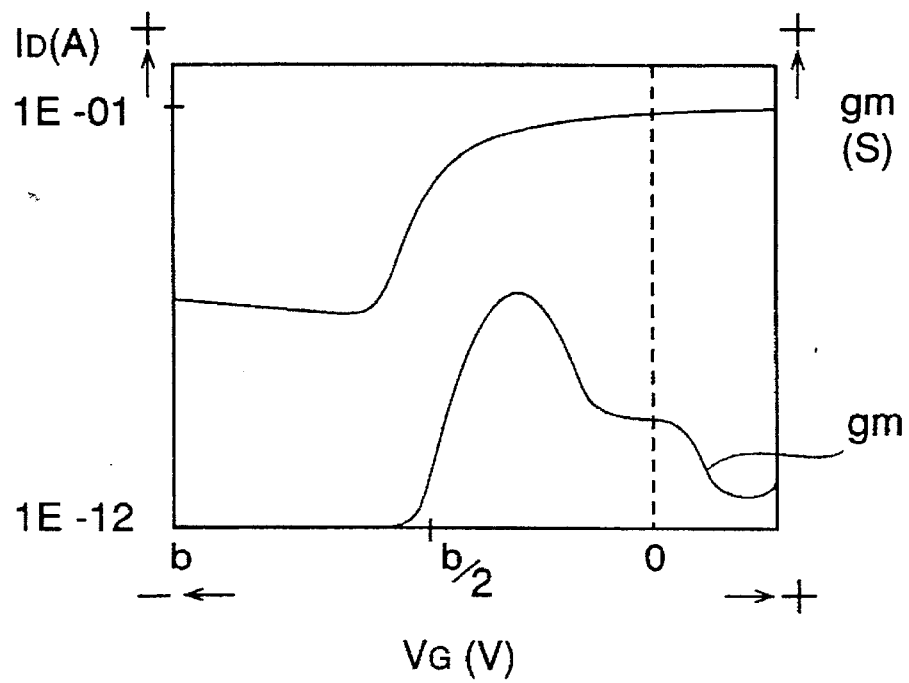
FIGS. 22(a) and 22(b) are diagrams showing the transconductance and the drain current, respectively, of the prior art semiconductor device.
Figure 22:
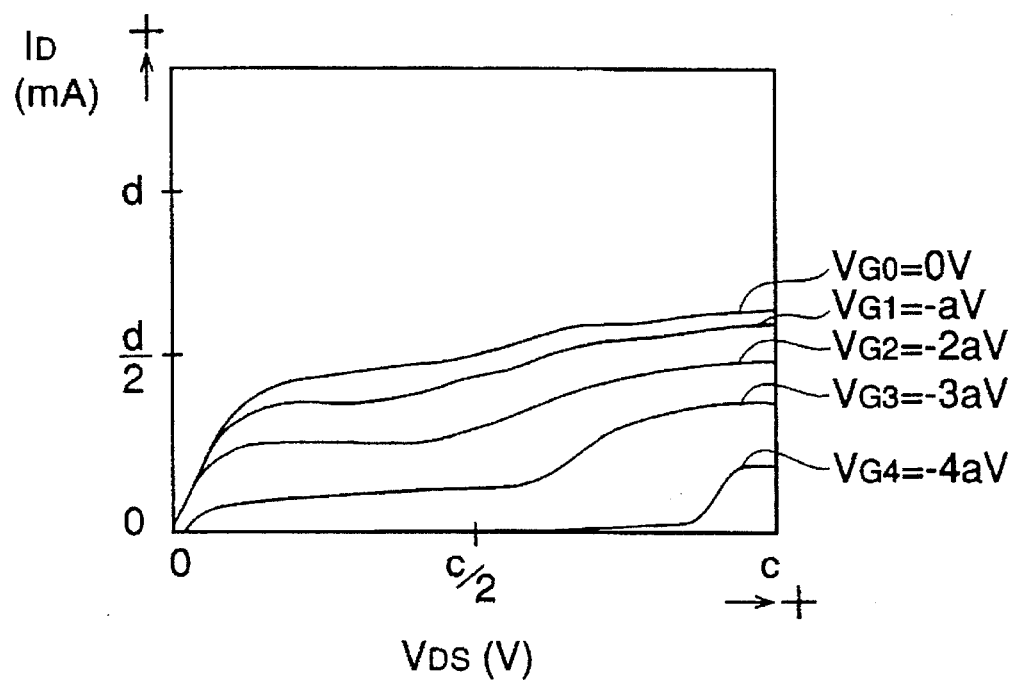

In this way, it is possible to relax channel confinement and, as shown in FIG. 4(a), it is possible to obtain good transconductance ($g_m$) even when the gate voltage is 0 V. In other words, in the case of the prior art FET, as shown in FIG. 22(b), even when the gate voltage is made closer to 0 V at equal intervals from the minus side, the drain current $I_D$ does not rise at equal intervals in the vicinity of 0 V. In the first embodiment, as shown in FIG. 4(b), when the gate voltage is made gradually closer to 0 V at equal intervals, the drain current $I_D$ rises approximately at equal intervals even in the vicinity of 0 V.

In addition, since the gate electrode 4 is closer to the source electrode 9 than to the drain electrode 8, between the drain electrode 8 and the source electrode 9, and the n' type GaAs region 31a is provided between the n type GaAs region 3a and the drain side n$^+$ type GaAs region 7a, electric field concentration at the periphery of the drain electrode 8 is prevented, whereby an FET with a high breakdown voltage and high power output can be produced.

The donor concentration, layer thickness, and width of the n' type GaAs region 31a are set to appropriate concentration and dimensions in accordance with the required FET characteristics and, when the width of the n type GaAs region 3a is 1 μm, the donor concentration of the n type GaAs region 3a is $2 \times 10^{17}$/cm$^3$, the donor concentration of the n' type GaAs region 31a is about $6 \times 10^{17}$/cm$^3$, the thickness of the n' type GaAs region 31a is 0.2 μm, and the width thereof is 0.7 μm, the gate drain breakdown voltage can be above −15 V, thereby satisfying the characteristics required for a high power semiconductor device.

In this first embodiment, by using the described fabricating process to form the n type GaAs layer 75 comprising the n type GaAs region 3a, the n' type GaAs region 31a, and the n$^+$ type GaAs region 7a, the depth of the surface depletion layer of a portion of the GaAs semiconductor substrate 1a where the engraved region 80 is formed, can be made sufficiently shallow. Thereby, the FET of the first embodiment avoids channel confinement up to an applied voltage closer to 0 V than in the prior art FET.

Therefore, as shown in FIG. 4(a), in the FET of this first embodiment, it is possible to obtain a good transconductance ($g_m$) when the negative voltage applied to the gate electrode 4 has a value closer to 0 V than in the prior art. In other words, as shown in FIG. 4(b) when the gate voltage is made closer to 0 V at equal intervals from the minus side, the drain current increases approximately at equal intervals even in the vicinity of 0 V.

In addition, since the gate electrode 4 is located closer to the source electrode 9 than to the gate electrode 8, between the drain electrode 8 and the source electrode 9, and the n' type GaAs region 31a is located between the n type GaAs region 3a and the drain side n⁺ side GaAs region 7a, electric field concentration at the periphery of the drain electrode 8 is prevented, whereby an FET with a high breakdown voltage and high power output is produced.

Embodiment 2

Figure 5:
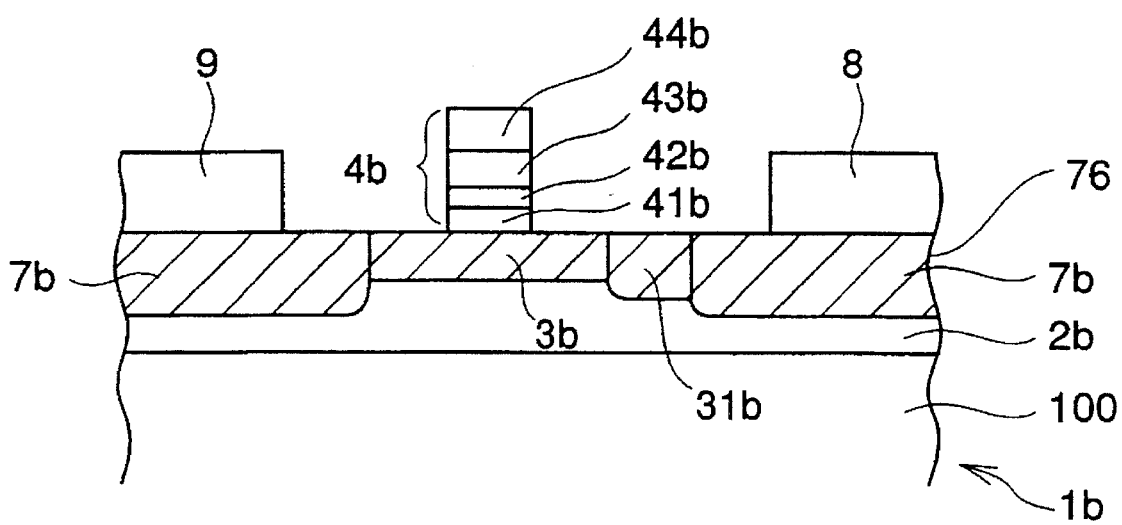
FIG. 5 is a cross-sectional view illustrating a semiconductor device according to a second embodiment of the present invention.
Figure 6:
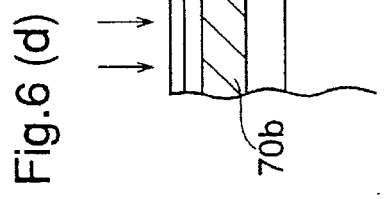
FIGS. 6(a)–6(f) are cross-sectional views illustrating processes for fabricating the semiconductor device of the second embodiment.
Figure 6:
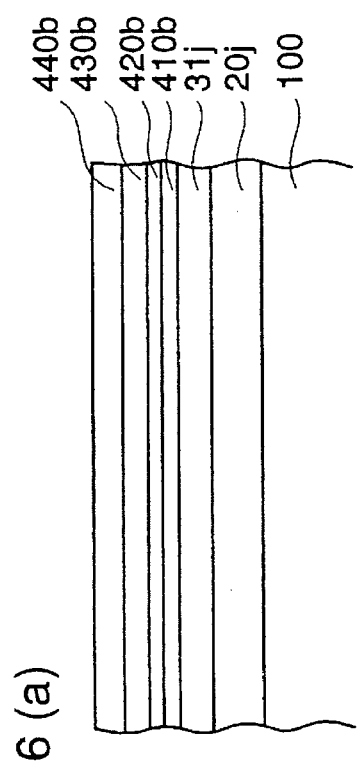
Figure 6:
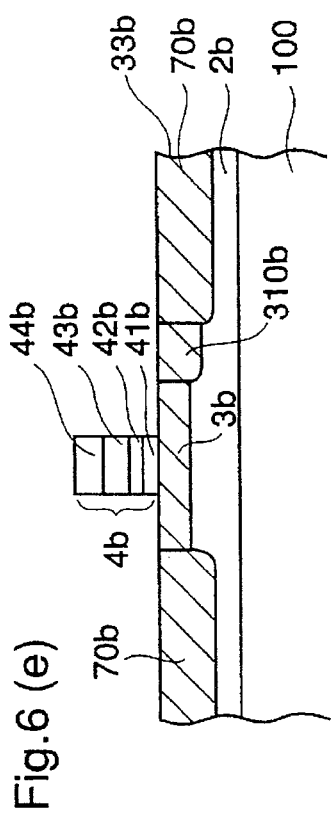
Figure 6:
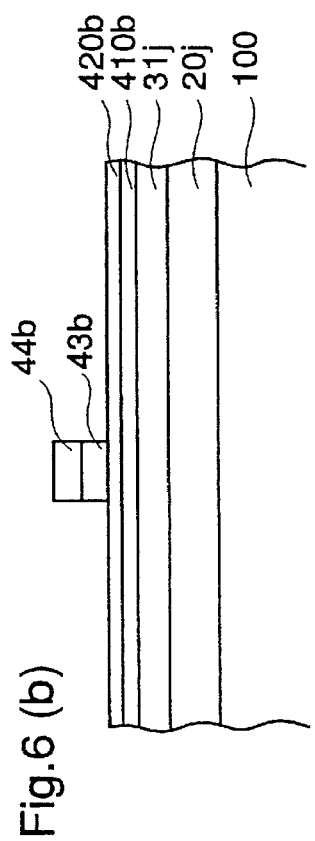
Figure 6:
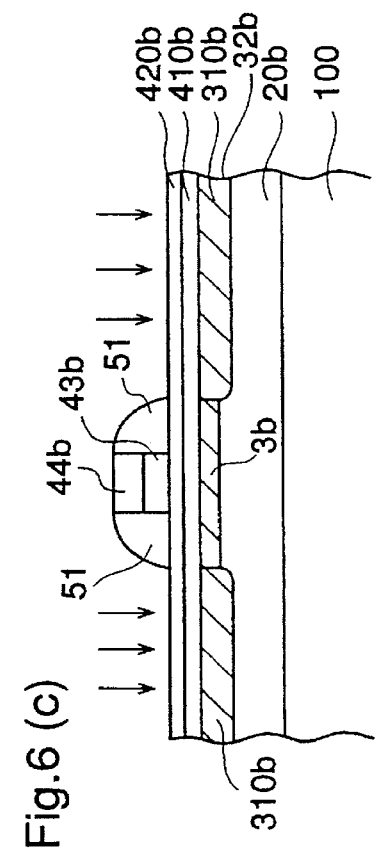
Figure 6:
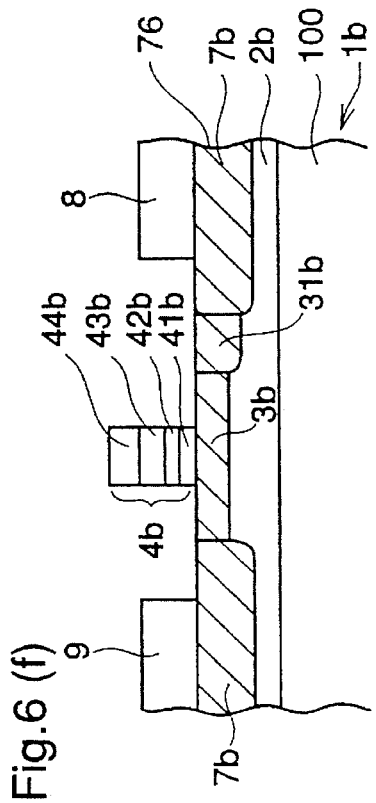

FIG. 5 is a cross-sectional view illustrating a semiconductor device according to a second embodiment of the present invention. In FIG. 5, the same reference numerals as in the FIG. 19 designate the same or corresponding elements. Numeral 1b designates a GaAs semiconductor substrate. Numeral 100 designates an i type GaAs layer on the Gas semiconductor substrate 1b. Numeral 2b designates a p type GaAs layer on the GaAs semiconductor substrate 1b. An n type GaAs layer 76 is located on the GaAs semiconductor substrate 1b and comprises the n type GaAs region 3b, the n' type GaAs region 31b, and the n⁺ type GaAs region 7b. Here, the donor concentrations of the n type GaAs region 3b, the n⁺ type GaAs region 31b, and the n⁺ GaAs regions 7b are the same as those of the n type GaAs region 3a, the n⁺ type GaAs region 31a, and the n⁺ GaAs regions 7a of the first embodiment.

The n⁺ type GaAs layer 7b of the semiconductor device of this embodiment comprises the n type GaAs region 3b having a first length gate electrode region at approximately the center portion of an upper surface, the n' type GaAs region 31b adjacent to the n type GaAs region 3b at the drain side end, the drain side n⁺ type GaAs region 7b at the drain side end of the n type GaAs region 31b adjacent to the n' type GaAs region 31b, and the source side n⁺ type GaAs region 7b at the source side end of the n type GaAs region 3b adjacent to the source side end of the n type GaAs region 3b. Numeral 8 designates a drain electrode on the drain side n⁺ type GaAs region 7b, numeral 9 designates a source electrode on the source side n⁺ type GaAs region 7b, and numeral 4b designates a gate electrode. This gate electrode 4b is a WSi layer 41b disposed on the n type GaAs region 3b as a normal Schottky junction, a W layer 42b laminated on the WSi layer 41b, a WSi layer 43b laminated on the W layer 42b, and a W layer 44b laminated on the WSi layer 43b. Here, the thickness of the WSi layer 41b is larger than 100 nm, the thickness of the W layer 42b is 100 nm, and the thicknesses of the WSi layer 43b and the W layer 44b are, respectively, 200 nm. Alternatively, the thickness of the WSi layer 43b may be 100 nm and the thickness of the W layer 44b may be 300 nm. In addition, the gate length of the gate electrode 4b is generally 0.5–1.0 μm.

The semiconductor device shown in FIG. 5 is an SAGFET having an offset gate construction in which the gate electrode 4 is closer to the source electrode 9 than to the drain electrode 8 between the drain electrode 8 and the source electrode 9, and the n' type GaAs region 31b is located at the drain side of the gate electrode.

In addition, the BPLDD structure in which the p type layer 2b is under the n type layer is adopted as in the first embodiment, but the usual LDD structure in which this p type layer is not included can be employed.

A description is given of a method of fabricating a semiconductor device of the second embodiment according to the cross-sectional views of FIGS. 6(a)–6(f).

As in the methods of the prior art and the first embodiment, the i type GaAs layer 100, the p type GaAs layer 20j, and the n type GaAs layer 31j are successively formed and, as shown in FIG. 6(a), the WSi film 410b, the W film 420b, the WSi film 430b, and the W film 440b are successively formed on the n type GaAs layer 31j of GaAs semiconductor substrate surface by sputtering.

A pattern for forming a part of the gate electrode 4b is formed and, according to this pattern, the WSi film 430b and the W film 440b are removed by RIE so that required parts for forming the gate electrode of the uppermost W film 440b and the second uppermost WSi film 430b remain, whereby the W film 44b and the WSi film 43b as shown in FIG. 6(b) are formed. Here, RIE is used because, in RIE, the third uppermost W film 420b can be used to detect the conclusion of the desired etching.

After the formation of the W film 44b and the WSi film 43b, the sidewall 51 shown in FIG. 6(c) is formed, as in the first embodiment. Thereafter, using the W film 44b, the WSi film 43b, and the sidewall 51 as masks, Si ions are implanted into the GaAs semiconductor substrate, through the WSi film 410b, thereby forming the n' type GaAs region 310b and the n type GaAs region 3b. Thus, on the p type GaAs layer 20b, to which the p type GaAs layer 20j is changed, as shown in FIG. 6(c), the n type GaAs layer 32b comprising the n' type GaAs region 310b and the n type GaAs region 3b are formed.

As shown in FIG. 6(d), on a region from the position on the W film 44b and the WSi film 43b to a position a predetermined distance from the drain side end of the W film 44b and the WSi film 43b toward the drain side, the photoresist 6 is formed with an offset, as in the first embodiment. After the formation of the photoresist 6, using the W film and the WSi film 43b, the sidewalls 51, and the photoresist 6 as masks, Si ions are implanted through the W film 420b and the WSi film 410b. Thereby, on the p type GaAs layer 2b, which is changed to the p type GaAs layer 20b, the n type GaAs layer 33b comprising the n type GaAs region 3b, the n' type GaAs region 310b, and the n⁺ type GaAs region 70b are formed.

After the formation of these respective layers, the photoresist 6 and the sidewall 51 are removed. Using the W film 44b and the WSi film 43b as a mask, the W film 420b and the WSi film 410b are isotropically etched. Thereby, the W film 42b and the WSi film 41b are formed and the gate electrode 4b is completed.

After the completion of the gate electrode 4b, the GaAs semiconductor substrate is activated by annealing, and the n type GaAs layer 76 comprising the n type GaAs region 3b, the n' type GaAs region 31b, and the n⁺ type GaAs region 7b are formed. In other words, the semiconductor substrate 1b having the p type GaAs layer 26 and the n type GaAs layer 76 is formed on the i type GaAs layer 100.

As shown in FIG. 6(f), the drain electrode 8 and the source electrode 9 are formed on the respective n⁺ type GaAs regions 7b, thereby completing the FET.

When a negative voltage is applied to the gate electrode 4b, as in the first embodiment, the gate depletion layer having a depth according to the voltage is broadened to the n type GaAs region 3b below the gate electrode 4. Since the depletion layer is broadened, the thickness of the channel below the gate electrode 4 becomes thinner, and the drain current $I_D$ flowing to the source electrode 9 is controlled in accordance with the magnitude of the applied voltage.

In this second embodiment, since the sidewall 51 is formed on the W film 420b, the n' type GaAs region 310b is not etched in the etching step for forming the sidewall 51, and the engraved part 80 in the prior art and the first embodiment (in FIGS. 19 and 1) is not formed. Therefore, channel confinement due to the engraved part 80 is prevented and good transconductance up to the vicinity of 0 V is obtained.

In addition, since the gate electrode 4 is disposed at a position closer to the source electrode 9 side than to the drain electrode 8 side, between the drain electrode 8 and the source electrode 9, and the n' type GaAs region 31b is provided between the n type GaAs region 3b and the drain side n⁺ type GaAs region 7b, electric field concentration at the periphery of the drain electrode 8 is prevented, whereby an FET with high breakdown voltage and high power output is produced. In addition, since the gate electrode 4b is made of a laminated layer structure of WSi and W, a reduction in the resistance of the gate electrode is achieved.

As described above, in this second embodiment, the sidewall 51 is formed on the W film 420b, and, using the W film 44b, the WSi film 43b, and the sidewall 51 as masks, Si ions are implanted through the W film 420b and the WSi film 410b into the GaAs semiconductor substrate. Using the resist 6, the W film 44b, the WSi film 43b, and the sidewall 51 as masks, Si ion implantation through the W film 420b and the WSi film 410b is further performed. Portions other than the desired portion of the W film 420b and the WSi film 410b are etched, thereby forming the gate electrode 4b. Therefore, no engraved part 80 is formed on the semiconductor substrate in the formation of the side wall 51, whereby, in addition to the effects of the prior art and the first embodiment, a high power FET that further relaxes channel confinement is fabricated.

In addition, since the gate electrode 4b is made of a laminated layer structure of WSi and W, a reduction in the resistance of the gate electrode is achieved.

Embodiment 3

Figure 7:
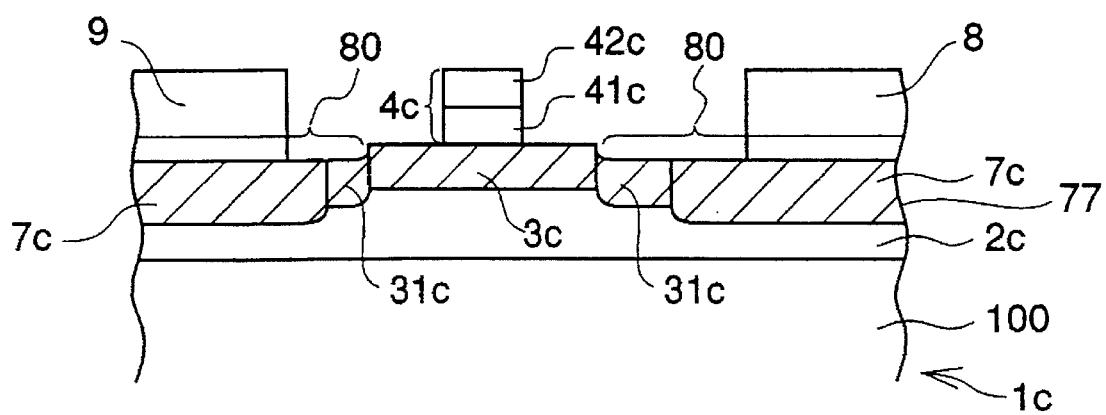
FIG. 7 is a cross-sectional view illustrating a semiconductor device according to a third embodiment of the present invention.
Figure 9:
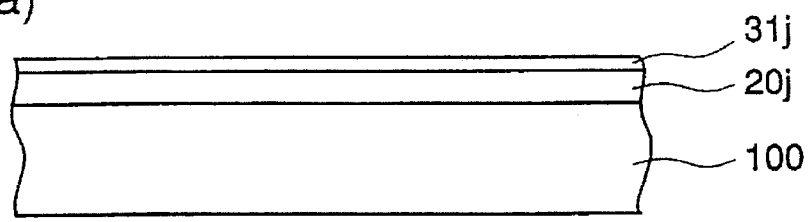
FIGS. 9(a)–9(e) are cross-sectional views illustrating processes for fabricating the semiconductor device of a fourth embodiment of the present invention.
Figure 9:
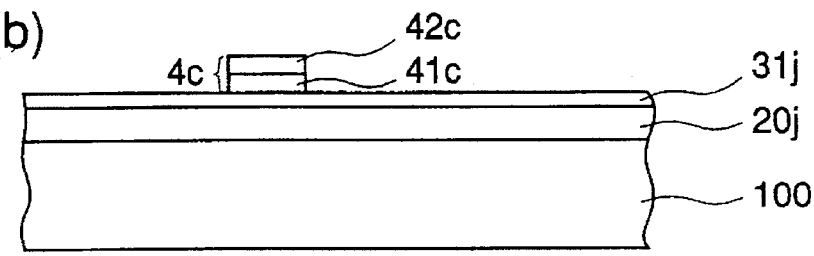
Figure 9:
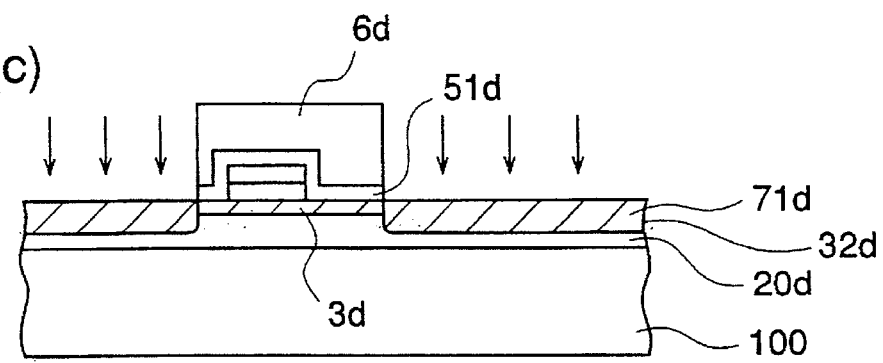
Figure 9:
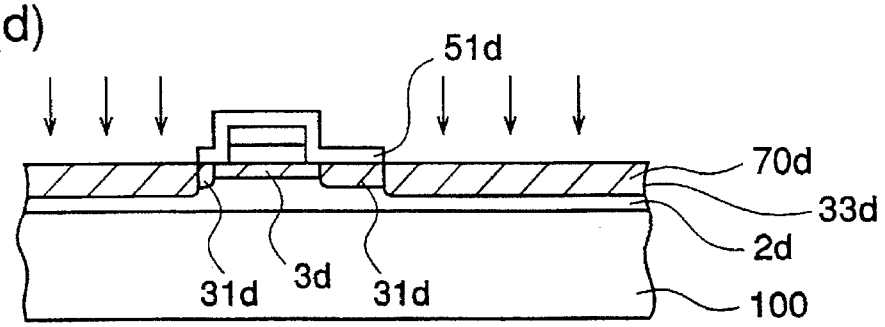
Figure 9:
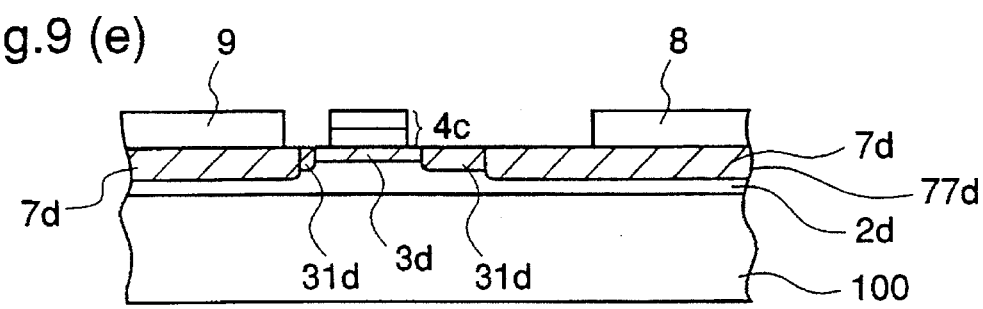

FIG. 7 shows a cross-sectional view illustrating a semiconductor device according to a third embodiment of the present invention. In FIG. 7, the same reference numerals as in FIG. 1 designate the same or corresponding elements. Numeral 1c designates a GaAs semiconductor substrate. Numeral 100 designates an i type GaAs layer on the GaAs semiconductor substrate 1a. Numeral 2c designates a p type GaAs layer on the GaAs semiconductor substrate 1c. An n type GaAs layer 77 is located on the GaAs semiconductor substrate 1c. This n type GaAs layer 77 comprises the n type GaAs region 3c, the n' type GaAs region 31c, and the n⁺ type GaAs region 7c, and numeral 80 designates an engraved part of the GaAs semiconductor substrate 1c. Here, the donor concentrations of the n type GaAs region 3c, the n' type GaAs region 31c, and the n⁺ type GaAs region 7c are the same as the n type GaAs region 3a, the n' type GaAs region 31a, and the n⁺ type GaAs region 7a of the first embodiment, and the gate width is the same as in the first embodiment.

The n type GaAs layer 77 of the semiconductor device of this embodiment has the n type GaAs region 3c having a first length gate electrode region at approximately the center of an upper surface, the drain side n' type GaAs region 31c at the drain side end of the n type GaAs region 3c, adjacent to the n type GaAs region 3c, and the drain n⁺ type GaAs region 7c at the drain side end of the n' type GaAs region 31c, adjacent to the n' type GaAs region 31c, the source side n' type GaAs region 31c at the source side end of the n type GaAs region 3c, adjacent to the n type GaAs region 3c, and the drain side n⁺ type GaAs region 7c at the source side end of the n' type GaAs region 31c, adjacent to the n' type GaAs region 31c. Numeral 8 designates a drain electrode on the drain n⁺ side GaAs region 7c, numeral 9 designates a source electrode on the source n⁺ type GaAs region 7c, numeral 41c designates a WSi layer forming the gate electrode, numeral 42c designates a W layer forming the gate electrode, and the gate electrode 4c includes the WSi layer 41c and the W layer 42c.

The semiconductor device shown in FIG. 7 is an SAGFET having an offset construction in which the gate electrode 4 is disposed closer to the source electrode side than to the drain electrode side, between the drain electrode 8 and the source electrode 9, and the length of the drain side n' type GaAs region 31c is larger than the length of the source side n' type GaAs region 31c.

In addition, the BPLDD structure in which the p type layer 2c is below the n type layer is adopted as in the first embodiment, but the usual LDD structure in which this p type layer is not provided can also be employed.

Next, a description is given of a method of fabricating a semiconductor device of the third embodiment along with the cross-sectional views of FIGS. 8(a)-8(f).

In the figures, the same reference numerals as shown in FIG. 7 and FIGS. 2(a)-2(f) designate the same or corresponding elements. Numeral 6c designates a resist at a region on the surface of the semiconductor substrate in the vicinity of the sidewalls, a distance from the drain side end of the region, and a distance from the source side end of a region for producing the gate electrode. In this embodiment, the length from the drain side end of the gate electrode to the drain side end of the resist 6c is longer than the length from the source side end of the gate electrode to the source side end of the resist 6c.

As in the prior art and the embodiments described above, after the i type GaAs layer 100, the p type GaAs layer 20j, and the n type GaAs layer 31j, which are shown in FIG. 2(a), are formed, as shown in FIG. 8(a), the gate electrode 4c comprising a refractory metal is formed by photolithography and dry etching after, for example, WSi as a lower layer and W as an upper layer are respectively laminated in a thickness of 200 nm, respectively, on the n type semiconductor layer 31j. Here, the gate electrode is made of a laminated structure of the WSi layer 41c and the W layer 42c to reduce the gate resistance. The total layer thickness and the film thickness ratio are optional. In addition, the metals used are not limited to WSi and W, and, for example, combinations of Pt, Au, Ti, Mo, Al, and WSiN can be arbitrarily selected.

Next, as shown in FIG. 8(b), the insulating film 5, such as SiO, is deposited by plasma CVD 400 nm thick, and, as shown in FIG. 8(c), the sidewall 51 is selectively formed only at the side wall of the gate electrode 4c by a dry etching technique, such as ECR etching. Though depending on the conditions of dry etching, the width of the side wall 5 ($L_{sw}$) is about 50-70% of the thickness of the SiO film 5 that is initially deposited.

Thereafter, as shown in FIG. 8(d), using the gate electrode 4c and the sidewall 51 as a mask, by implanting Si ions at an accelerating voltage of 80 KeV and a dosage of $5 \times 10^{12}$/cm², the n' type GaAs region 310c and the n type GaAs region 3c are formed. Thereby, on the p type GaAs layer 20c to which the p type GaAs layer 20j is changed, the n type GaAs layer 32c, comprising the n' type GaAs region 310c and the n type Gas region 3c, is formed.

As shown in FIG. 8(e), after the resist 6c is formed at a region extending from a position 1 μm from the drain side end of the gate electrode 4c toward the drain side to a position 0.5 μm from the source side end of the gate electrode 4c toward the source side using the resist 6c, the gate electrode 4c, and the sidewall 51 as a mask, Si is implanted at an accelerating voltage of 100 KeV and dosage of $3 \times 10^{13}$/cm². Thereby, the n type GaAs 33c comprising the n type GaAs region 3c, the n' type GaAs region 3c, the n' type GaAs region 3c, and the n⁺ type GaAs region 70c are formed in the p type GaAs layer 2c that is changed from the p type GaAs layer 20c.

Then, after the removal of the photoresist 6c and the sidewall 51, the n' type GaAs region 31c and the n⁺ type GaAs region 70c are activated by annealing. Thereby, the n type GaAs layer 77, comprising the n type GaAs region 3c, the n' type GaAs region 31c, and the n⁺ type GaAs region 7c, is formed. In other words, the semiconductor substrate 1a having the p type GaAs layer 2c and the n type GaAs layer 77 is formed on the i type GaAs layer 100 as shown in FIG. 8(f).

After the formation of the GaAs semiconductor substrate 1c, as shown in FIG. 8(f), the drain electrode 8 and the source electrode 9 are formed on respective n⁺ type GaAs regions 7c by evaporation and lift-off, completing the FET.

The operation and function of the FET of this third embodiment are the same as those of the first embodiment and the depth of the surface depletion layer in the n' type GaAs region 31c generated below the engraved part 80 is shallower than the surface depletion layer of the prior art n type GaAs region 3j because the donor concentration of the n' type GaAs region 31c is larger than that of the n type GaAs region 3j of the prior art FET. Thereby, channel confinement is relaxed and good transconductance ($g_m$) can be obtained even when the gate voltage is 0 V.

In addition, in this third embodiment, the n' type GaAs region 31c is also provided at the source side of the gate electrode, and the gate electrode 4 is disposed closer to the source electrode 9 than to the drain electrode 8, between the drain electrode 8 and the source electrode 9, and the length of the drain side n' type GaAs region 3c is longer than the length of the source side n' type GaAs region 3c, whereby electric field concentration at the periphery of the drain electrode 8 is prevented and the FET characteristics that are required for a high breakdown voltage and high power semiconductor device are obtained.

Furthermore, in this third embodiment, the n' type GaAs region 31c is also provided between the n type GaAs region 3c and the drain side and source side n⁺ type GaAs region 7c, whereby the high dopant concentration n⁺ GaAs region does not exist close to the gate electrode and the leakage current generated when a still larger negative voltage is applied to the gate electrode is suppressed and the gate source electrode breakdown voltage ($V_{gso}$) is increased. For example, while in a case where the gate-to-source electrode interval is 0.8 μm and the gate-to-drain electrode interval is 2.5 μm, $V_{gso}$=−6 V in the prior art device, if the n' type GaAs region 31c is provided at the source electrode side and is 0.5 μm long, $V_{gso}$=−10 V.

In addition, by making the gate electrode a double layer structure comprising W and WSi, the gate resistance is approximately one-sixth that of the gate electrode comprising only WSi, and operation at high frequency is improved.

In this third embodiment, since the resist 6c is formed at a region on the GaAs semiconductor substrate from a position a first distance from the drain side end of the gate electrode 4c to a position a second distance from the source side end of the gate electrode 4c and is used as a mask, and ion implantation is used to form an n⁺ type GaAs region, the n' type GaAs semiconductor region 31c can also be formed at the source side of the gate electrode 4c. Therefore, in addition to the effect of the first embodiment, a semiconductor device that has enhanced gate source breakdown voltage and has less leakage current is obtained.

Embodiment 4

An example of a fabricating method in which the engraved part 80 is not formed as in the third embodiment is described as the fourth embodiment with reference to FIGS. 9(a)–9(e).

In FIGS. 9(a)–9(e), the same reference numerals as in FIGS. 8(a)–8(f) designate the same or corresponding elements. Numeral 51d designates an insulating film, and numeral 6d designates a photoresist on the insulating film 51d.

As in the prior art device and the previously described embodiments, after the i type GaAs layer 100, the p type GaAs layer 20j, and the n type GaAs layer 31j shown in FIG. 2(a) are formed, the gate electrode 4c is formed by photolithography and dry etching. These steps follow laminating WSi as a lower layer and W as an upper layer, respectively 200 nm thick on the n type GaAs layer 31j, as shown in FIG. 9(b). The laminated layer structure is adopted for the same reason as in the third embodiment.

In FIG. 9(c), after the insulating film such as SiO is deposited by plasma CVD to a thickness corresponding to the side wall finishing dimension, for example, to 250 nm, the resist 6d is formed at a region from a position 1 μm from the drain side end of the gate electrode 4c toward the drain to a position 0.5 μm from the source side end of the gate electrode 4c toward the source side. Thereafter, dry etching is performed by ECR etching to form the insulating film 51d.

In FIG. 9(d), using the resist 6d, the insulating film 51d, and the gate electrode 4c as a mask, Si ions are implanted at an accelerating voltage of 100 KeV and dosage of 3×10¹³/cm², whereby the n type GaAs layer 33d comprising the n type GaAs region 3d and the n⁺ type GaAs region 71d is formed on the p type GaAs layer 20d to which the p type GaAs layer 20j is changed.

After the removal of the resist 6d, using the gate electrode 4c and the insulating film 51d of the side surface portion of the gate electrode 4c as a mask and using the insulating film 51d at the surface of the semiconductor substrate as a through film, Si ions are again implanted at an accelerating voltage of 80 KeV and dosage of 5×10¹²/cm², whereby the n type GaAs layer 33d, comprising the n type GaAs region 3d, the n' type GaAs region 31d, and the n⁺ type GaAs region 77d, is formed on the p type GaAs layer 2d to which the p type GaAs layer 20d is changed. The n' type GaAs region 31d and the n⁺ type GaAs region 71d are activated simultaneously, thereby forming the n type GaAs layer 77d. This activation processing can be performed separately.

Finally, the insulating film 51d is removed and, as shown in FIG. 9(e), a source electrode 8 and a drain electrode 9, both comprising AuGe/Ni/Au and having an ohmic property, are formed on respective n⁺ type semiconductor regions 7d, thereby completing the SAGFET with the BPLDD structure having no engraved part 80.

In this embodiment, the insulating film 51d is formed in place of the sidewall 51 formed in the third embodiment, and the ion implantation is performed using this film 51d as a mask and a through film. Therefore, by forming the insulating film 51d using an etching method that is different from the third embodiment, the etching selectivity ratio between the respective insulating films 51d and the GaAs layer 77d is sufficiently large that the n type GaAs layer 77d is not etched during removal of the insulating film 51d. If the surface of the n type GaAs layer 77d is etched, the depth of the engraved part is negligible as compared with the prior art and the first and third embodiments.

Alternative 1

As an alternative to this fabricating method, it is possible to perform the ion implantation after processing the insulating film 51d with the resist 6d shown in FIG. 9(c), removing the resist 6d, thereby resulting in the state of FIG. 9(d), using the gate electrode 4c and the insulating film 51d at the side surface portion of the gate electrode 4c as a mask and using the insulating film 51d at the surface of the semiconductor substrate as a half through film.

According to this method, by adjusting the conditions of ion implantation, it is possible to form the n type GaAs region, the n' type GaAs region 31d, and the n⁺ type GaAs region 71d simultaneously, and one of the ion implantation steps of the first fabricating method can be omitted.

Since in this fourth embodiment the n' type GaAs layer is also formed at the source side, as in the third embodiment, the surface depletion layer is shallow, with the same effect as in the third embodiment. Furthermore, in this fabricating method, after forming the insulating film, part of the insulating film is removed, leaving a portion from a first distance from the drain side end of the gate electrode toward drain side to a position a second distance from the source side end of the gate electrode toward the source side. The ion implantation step uses this film remainder as a mask, a through film, or a half transparent film, and, in addition to the effect of the third embodiment, no engraved part is formed, whereby channel confinement is further relaxed.

Embodiment 5

Figure 10:
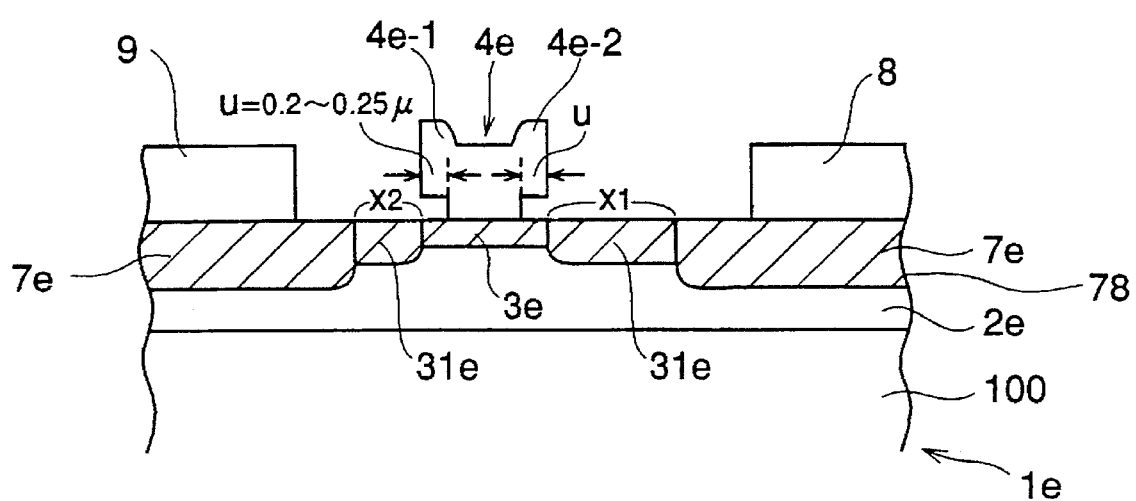
FIG. 10 is a cross-sectional view illustrating a semiconductor device according to a fifth embodiment of the present invention.
Figure 11:
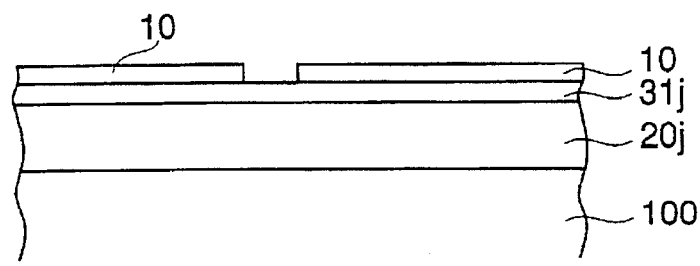
FIGS. 11(a)–11(e) are cross-sectional views illustrating processes for fabricating the semiconductor device of the fifth embodiment.
Figure 11:
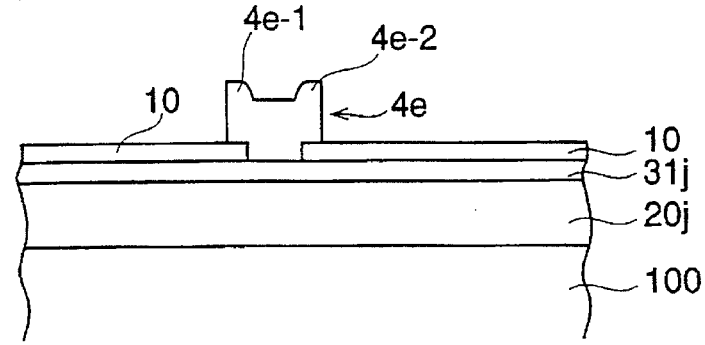
Figure 11:
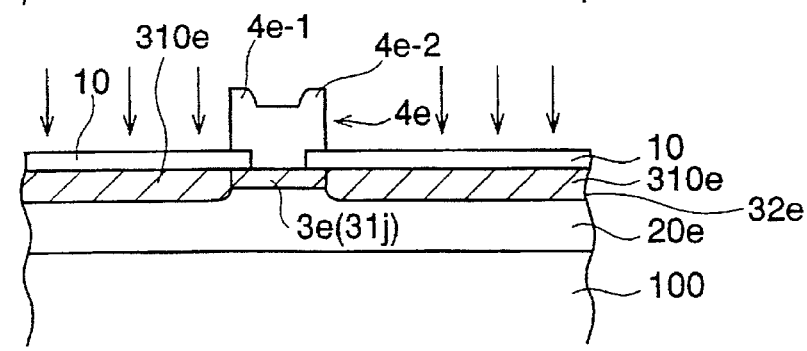
Figure 11:
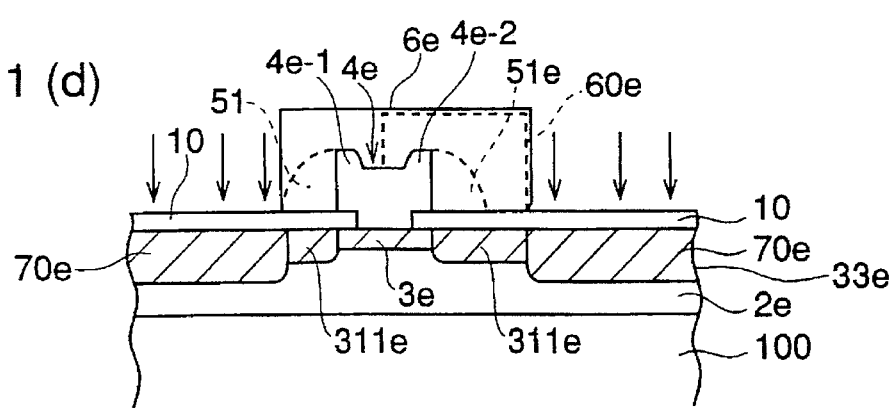
Figure 11:
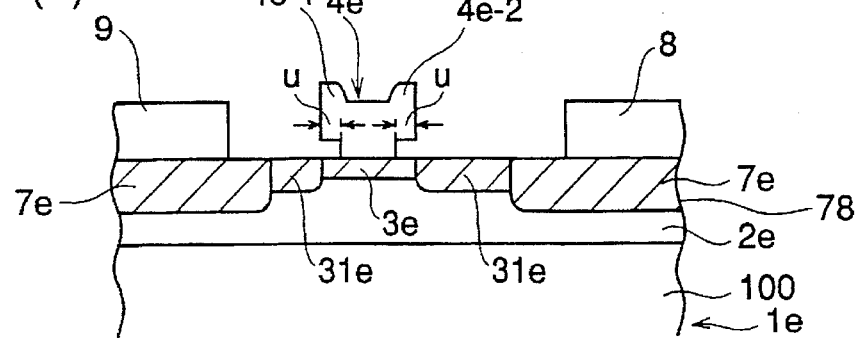

FIG. 10 is a cross-sectional view illustrating a semiconductor device according to a fifth embodiment of the present invention. In FIG. 10, the same reference numerals as those shown in FIG. 1 designate the same or corresponding elements. A GaAs semiconductor substrate 1e has formed on it an i type GaAs layer 100. A p type GaAs layer 100 is formed on the GaAs semiconductor substrate 1c, and an n type GaAs layer 78 is formed on the GaAs semiconductor substrate. This n type GaAs layer 78 comprises the GaAs region 3e, the n' type GaAs region 31e, and the n⁺ type GaAs region 7e. The donor concentrations of the n type GaAs region 3e, the n' type GaAs region 31e, and the n⁺ type GaAs region 7e are the same as the n type GaAs region 3a, the n' type GaAs region 31a, and the n⁺ type GaAs region 7a of the first embodiment.

In addition, numeral 4e designates a gate electrode comprising a refractory metal, such as WSi, disposed on the n type GaAs region 3e, and numerals 4e-1, 4e-2 designate projecting parts at the drain side and the source side of the gate electrode, respectively, projecting toward the drain side and the source side, respectively. Here, the width of the junction surface of the gate electrode 4e and the n type GaAs region 3e is 0.5 μm–1.0 μm and the overlapping amounts u of the projecting parts 4e -1, 4e -2 are 0.20–0.25 μm.

The n type GaAs region 3e is disposed beneath the gate electrode 4e including beneath the projecting parts 4e-I, 4e-2, and the source side end of the projecting part 4e-1 is positioned above the source side end of the n type GaAs region 3e and the drain side end of the projecting part 4e-2 is positioned above the drain side end of the n type GaAs region 3e.

In addition, the semiconductor device of this embodiment is an SAGFET having an offset construction with the gate electrode 4e at a position closer to the source electrode side than to the drain electrode side between the drain electrode 8 and the source electrode 9, and the length $x_1$ of the drain side n' type GaAs region 31e is longer than the length $x_2$ of the source side n' type GaAs region 31e. The BPLDD structure in which the p type layer 2e is located below the n type layer is similar to the first embodiment but the conventional LDD structure that does not include this p type layer may be employed.

A description is given of a first method of fabricating the fifth embodiment with reference to the cross-sectional diagrams shown in FIGS. 11(a)–11(e).

First of all, as in the prior art method, the GaAs semiconductor substrate shown in FIG. 19(a) is formed and an insulating film is formed on this GaAs semiconductor substrate. Thereafter, as shown in FIG. 11(a), a region of the insulating film where the gate electrode 4 is to be formed is removed and the drain side and the source side insulating film 10 is formed. As a result, a gate region where the gate electrode 4e is to be formed is exposed.

After the formation of the insulating film 10, the electrode material is deposited on the gate region of the n type GaAs layer 31j and on the drain side and source side end parts of the insulating film 10 adjacent to the gate region and the gate electrode 4e having the projecting parts 4e-1, 4e-2 is formed.

After the formation of the gate electrode 4e, as shown in FIG. 11(c), using the gate electrode 4e as a mask and using the insulating film 10 as a through film, Si is implanted into the semiconductor substrate. Thereby, the n type GaAs layer 32e comprising the n' type GaAs region 310e and the n type GaAs region 3e is formed on the p type GaAs layer 20 to which the p type GaAs layer 20j is changed.

As shown in FIG. 11(d), the photoresist 6e is formed on a region of the insulating film 10 from a position a first distance from the drain side end of the gate electrode 4e toward the drain side to a position a second distance from the source side end of the gate electrode toward the source side. Further, using the gate electrode 4e and the photoresist 6e as a mask and using the insulating film 10 as a through film, Si is implanted into the GaAs semiconductor substrate. Thereby, the n type GaAs layer 33e comprising the n type GaAs region 3e, the n' type GaAs region 311e, and the n⁺ type GaAs region 70e are formed on the p type GaAs layer 2e to which the p type GaAs layer 20e is changed.

After the ion implantation, the photoresist 6e is removed, and the n' type GaAs region 311e and the n⁺ type GaAs region 70e are activated by annealing, and the n type GaAs layer 78, comprising the n type GaAs region 3e, the n' type GaAs region 31e, and the n⁺ type GaAs region 7e shown in FIG. 11(e) is formed. In other words, the semiconductor substrate 1e having the p type GaAs layer 2e and the n type GaAs layer 78 is formed on the i type GaAs layer 100 shown in FIG. 11(f).

After removal of the respective insulating films 10, the drain electrode 8 and the source electrode 9 shown in FIG. 11(e) are formed on the n⁺ type GaAs layer 7e by evaporation and lift-off, thereby completing the FET.

Alternative 1

In the fabricating method described above, after the formation of the GaAs layer 32b, the photoresist 6e is formed. However, in place of the photoresist 6e, the sidewalls 51e and the photoresist 6e shown in FIG. 11(d) may be used to form the FET of the fifth embodiment. In this case, the insulating film 10 and the sidewall 51e, formed later, may comprise different kinds of materials.

First of all, as described above, the GaAs layer 32e is formed as shown in FIG. 11(d). In this embodiment, since the surface of the GaAs semiconductor substrate is coated with the respective insulating films 10, even when the sidewall 51e is formed, the n type GaAs layer 31j of the GaAs semiconductor substrate is not etched, differently from the prior art and the first embodiment. Thereafter, the photoresist 60e, which is offset toward the drain side, is formed as shown in FIG. 11(d).

After the formation of the sidewall 51e, as shown in FIG. 11(d), using the gate electrode 4e, the sidewalls 51e, and the photoresist 60e as a mask, and using the respective insulating films as a through film, Si is implanted into the GaAs semiconductor substrate. Thereby, the n type GaAs layer 33e, comprising the n type GaAs region 3e, the n' type GaAs region 311e, and the n⁺ type GaAs region 70e, is formed.

After the formation of the n type GaAs layer 33e, the sidewall 51e and the photoresist 60e are removed and the n' type GaAs region 311e and the n⁺ type GaAs region 70e are activated by annealing, thereby forming the GaAs semiconductor substrate 1e shown in FIG. 11(e). Thereafter, the drain electrode 8 and the source electrode 9 are formed on the n⁺ type GaAs layer 7e, completing the FET.

Alternative 2

Figure 12:
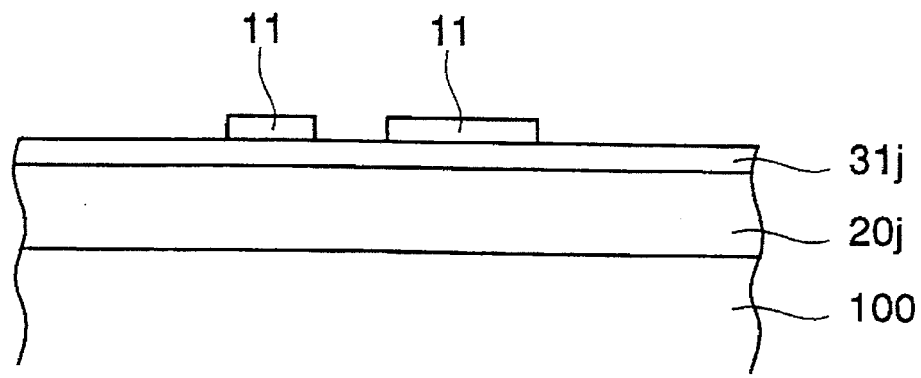
FIGS. 12(a)–12(c) are cross-sectional views illustrating processes for fabricating the semiconductor device according to a second alternative of the fifth embodiment of present invention.
Figure 12:
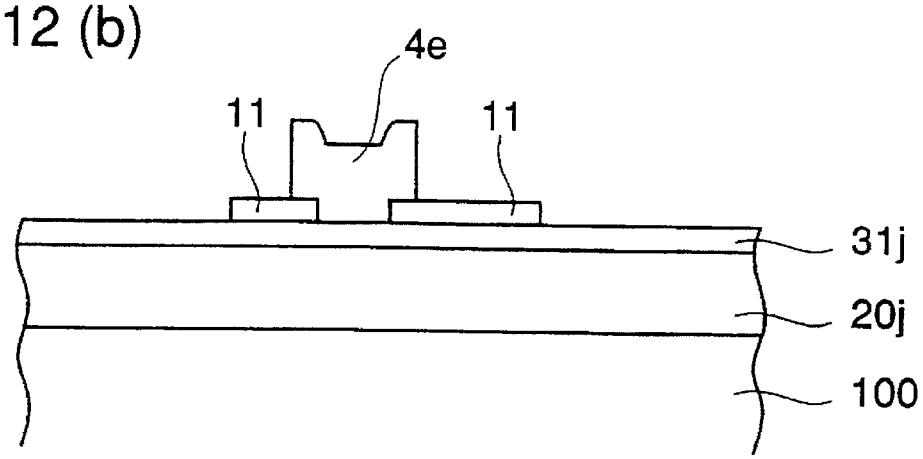
Figure 12:
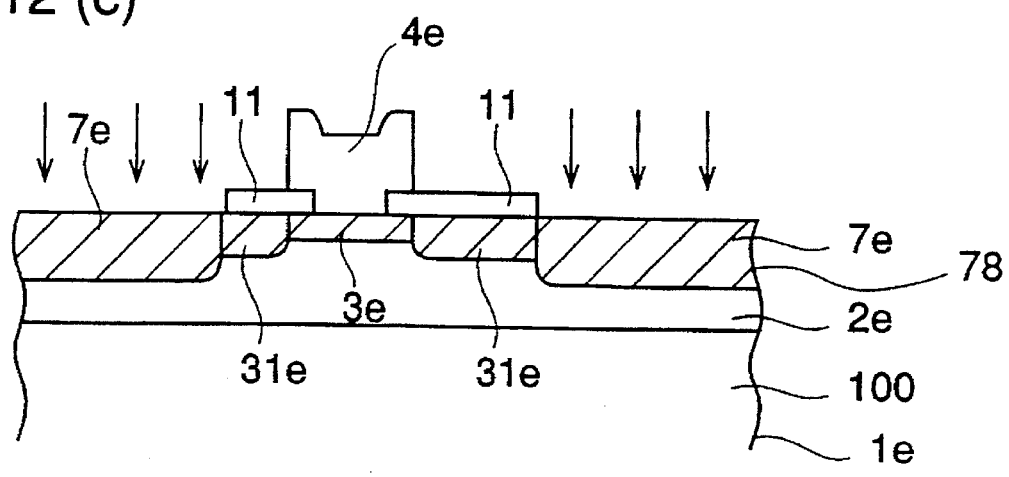

Another method for fabricating the semiconductor device of the fifth embodiment using the insulating film 11 in place of the insulating film 10 of the first method is described with reference to FIGS. 12(a)–12(c).

First of all, after forming a GaAs semiconductor substrate shown in FIG. 12(a), as in the prior art, an insulating film is formed and etched, leaving a region from the drain side end of a gate region for the gate electrode to a position a first distance toward the drain side and a region from the source side end of the gate electrode to a portion a second distance toward the source side, thereby forming the insulating film 11 shown in FIG. 12(a). The insulating film 11 comprises the same material as the insulating film 10, and the thickness is the same as the insulating film 10.

After the formation of the respective insulating films 11, electrode material is deposited on the gate region and a desired region on the drain side and source side insulating film 11 adjacent the gate region, thereby forming the gate electrode 4e as shown in FIG. 12(b).

After the formation of the gate electrode 4e, as shown in FIG. 12(c), using the gate electrode 4e as a mask and using the insulating film 11 as a through film, Si is implanted and, thereafter, the GaAs semiconductor substrate is activated by annealing, whereby the n type GaAs layer 78 comprising the n type GaAs region 3e, the n' type GaAs region 31e, and the n' type GaAs region 70e is formed. In other words, the semiconductor substrate 1e having the p type GaAs layer 2e and the n type GaAs layer 78 on the i type GaAs layer 100, as shown in FIG. 12(c), is formed.

After the formation of the GaAs semiconductor substrate 1e, the respective insulating films 11 of the GaAs semiconductor substrate 1e are removed, and the drain electrode 8 and the source electrode 9 are formed, thereby completing the FET.

In this way, in the method of this fifth embodiment, by providing the insulating films 10 and 11 and removing the films using an etching method different from those used in the prior art and the first and third embodiments where sidewalls are formed, the etching selectivity ratio between the respective insulating films 10 and 11 and the GaAs layer 78 can be made large, and, while removing the respective insulating films 10 and 11, the n type GaAs layer 78 is not etched, and no engraved part is formed. Even if the surface of the GaAs layer 78 is etched, the depth of the engraved part is negligible relative to the prior art and the first and third embodiments.

In addition, even when the sidewall 51e is formed as in Alternative 1, since the sidewalls are formed on the respective insulating films 10, the n type GaAs layer 78 would not be engraved by the etching, which is different from the prior art and the first and second embodiments. In addition, as in Alternative 2, the insulating films 11 are formed at regions at respective distances from the drain side end of the gate electrode and from the source side end of the gate electrode. In the drain side and source side regions, which sandwich the gate region, the gate electrode 4e is formed. The desired regions of the insulating film 11 are adjacent to the gate region for providing the gate electrode 4e. Therefore, ion implantation is performed using the insulating film 11 as a through film, eliminating one of the ion implantation steps.

Figure 13:
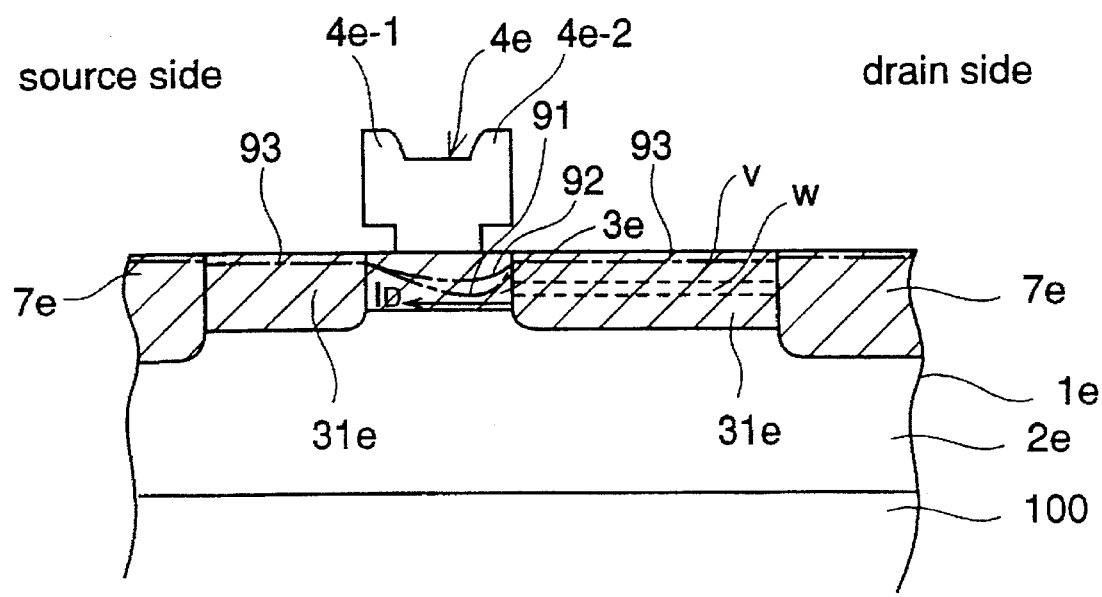
FIG. 13 is a cross-sectional view for explaining the operation of the semiconductor device of the fifth embodiment.

FIG. 13 is an enlarged cross-sectional view illustrating the vicinity of the gate electrode 4e. When a negative voltage is applied to the gate electrode 4, the gate depletion layer having a depth in accordance with the voltage is broadened into the n type GaAs region 3a below the gate electrode 4 as in the prior art. Since the depletion layer is broadened, the thickness of the channel below the gate electrode 4 is thinner and the drain current $I_D$ flowing to the source electrode 9 side is controlled in accordance with the magnitude of the applied voltage. Here, the same reference numerals in FIGS. 13 and 21 designate the same elements. Reference character w represents the deepest position of the surface depletion layer of the FET where there is an engraved part 80 in the prior art device shown in FIG. 21, and reference character v represents the deepest position of the surface depletion region of the FET where an n' type layer is provided at the engraved part 80 in the first embodiment shown in FIG. 3.

In this fifth embodiment, since no engraved part 80 is formed at the FET, channel confinement due to the engraved part 80 is reduced as compared to the prior art device and the first and third embodiments, whereby good transconductance is obtained up to 0 V.

In this fifth embodiment, after forming the gate electrode 4e having the projecting parts 4e-1 and 4e-2, Si is implanted using the gate electrode 4e as a mask, and the n type GaAs region 3e is formed below the gate electrode 4e, including below the projecting parts 4e-1 and 4e-2, whereby the n type GaAs region 3e is formed without using sidewalls. Thus, in addition to the effect of the third embodiment, a semiconductor device without an engraved part is obtained.

In the FET of the fifth embodiment, the thickness of the channel below the surface depletion layer in the n' type GaAs layer 31e is thicker than v in the FETs of the first and the third embodiments as shown in FIG. 13. As a result, the FET of this fifth embodiment relaxes channel confinement to a greater extent than the FETs of the first and the third embodiments, and even when a negative voltage close to 0 V is applied to the gate electrode 4e, good transconductance will be obtained.

In the FET of the fifth embodiment, when a negative gate voltage applied to the gate electrode 4b is made closer to 0 V, the reduction in the transconductance ($g_m$) can be suppressed to a greater extent than in the first and the third embodiments and a higher value of transconductance can be obtained even when the gate voltage is 0 V.

In addition, since even when the sidewalls are formed as a mask, as in Alternative 1, the sidewalls 51e are formed on the insulating film 10 after the insulating films 10 are formed on the GaAs semiconductor substrates, the FET can be fabricated without engraving the surface of the GaAs semiconductor substrate, unlike the prior art fabricating method.

Since, in Alternative 2, after the formation of the respective insulating films 11, the gate electrode 4e is formed and then, using the gate electrode 4e as a mask and using the respective insulating films as a through film, ion implantation is performed, and the ion implantation step of the first fabricating method can be omitted.

Embodiment 6

Figure 14:
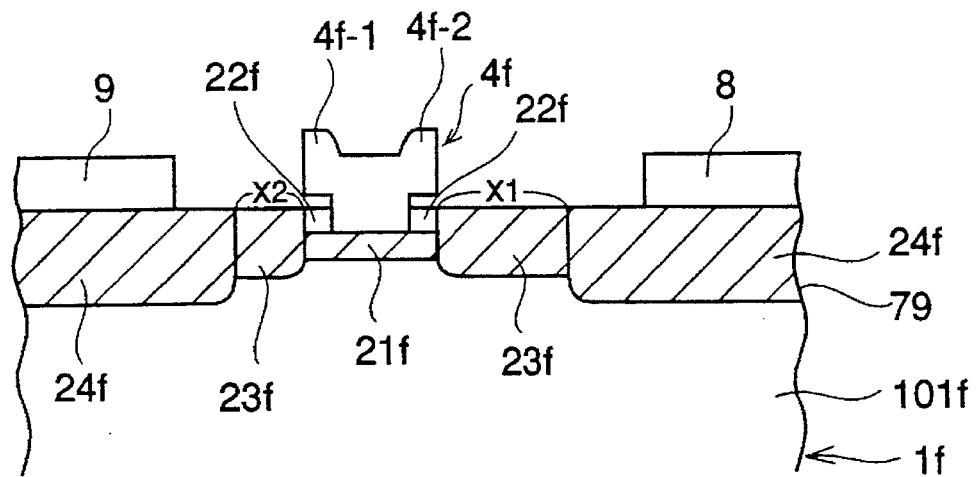
FIG. 14 is a cross-sectional view illustrating a semiconductor device of a sixth embodiment of the present invention.

FIG. 14 is a cross-sectional view illustrating a semiconductor device according to a sixth embodiment of the present invention. In the FIG., a GaAs semiconductor substrate 1f has an n type GaAs layer 101f on it. An n type GaAs layer 79 is formed on the GaAs semiconductor substrate 1f, and this n type GaAs layer 79 comprises the n type GaAs region 21f, the n' type GaAs region 23f, and the n⁺ type GaAs layer 24f.

In addition, numeral 4f designates a gate electrode, such as a refractory metal comprising WSi, disposed on the n type GaAs region 21f, and numerals 4f-1, 4f-2 represent projecting parts at the drain side and the source side surfaces of the gate electrode projecting toward the drain side and the source side, respectively. The width of the junction surface of the gate electrode 4f and the n type GaAs region 21f is 0.5–1.0 μm, and the overlap u of the projecting portions 4f-1 and 4f-2 is 0.20-0.25 μm. Numeral 22f is an i type GaAs region on the n type GaAs region 21f below the projecting parts 4f-1 and 4f-2. Here, the donor concentrations of the n type GaAs region 21f, the n' type GaAs region 23f, and the n⁺ type GaAs region 24f are the same as those of the n type GaAs region 3a, the n' type GaAs region 31a, and the n⁺ type GaAs region 7a of the first embodiment, respectively.

The n type GaAs region 21f is disposed below the gate electrode 4f, including below the projecting parts 4f-1 and 4f-2, and the i type GaAs region 22f is located on the n type GaAs region 21f below the projecting parts 4f-1 and 4f-2. In addition, the semiconductor device according to a sixth embodiment is an SAGFET having an offset construction in which the gate electrode 4f is disposed at a position closer to the source electrode than to the drain electrode, between the drain electrode 8 and the source electrode 9, and the length ($x_1$) of the drain side n' type GaAs region 23f is longer than the length ($x_2$) of the source side n' type GaAs region 23f.

A description is given of a method of fabricating a semiconductor device according to a sixth embodiment of the present invention with reference to the cross-sectional views of FIGS. 15(a)–15(e).

By a crystal growth method such as MBE, the n type GaAs film 210f and the i type GaAs film are formed on the i type GaAs semiconductor substrate 103, and an insulating film is deposited on the i type GaAs film. As shown in FIG. 15(a), a region of the insulating film for forming the gate electrode 4f is removed, thereby forming the insulating film 12. Using the insulating film 12 as a mask, the i type GaAs film is etched to remove a region of the i type GaAs film for forming the gate electrode 4b, thereby forming the i type GaAs film 220f at the drain and source sides. Thus, a gate region of the n type GaAs film 210f where the gate electrode 4b is formed is exposed.

On the gate region of the n type GaAs layer 210f and on the respective end parts of the drain side and source side insulating films 12 adjacent to the gate region, electrode material is deposited, whereby a gate electrode 4f having projecting portions 4f-1 and 4f-2 shown in FIG. 15(b) is formed.

Then, as shown in FIG. 15(c), using the gate electrode 4f as a mask and using the insulating film 12 as a through film, Si is implanted into the GaAs semiconductor substrate, whereby the n' type GaAs region 230a and the n type GaAs region 3a are formed. Thereby, the n type GaAs layer 32f comprising the n type GaAs region 21f and the n' type GaAs region 230f is formed on the i type GaAs region 102 to which the i type GaAs layer 103 is changed, and the i type GaAs region 22f is formed below the projecting parts 4f-1 and 4f-2 of the gate electrode on the n type GaAs region 21f.

After the formation of the n type GaAs layer 32, the photoresist 6f shown in FIG. 15(d) is formed and, thereafter, Si is implanted into the GaAs semiconductor substrate 101f. Thereby, on the i type GaAs layer 101f to which the i type GaAs layer 102 is changed, the n type GaAs layer 33f comprising the n type GaAs region 21f, the n' type GaAs region 231f, and the n⁺ GaAs region 240f, and the i type GaAs region 22f are formed.

Next, the photoresist 60 and the insulating film 12 are removed, and further, the n' type GaAs region 23f and the n⁺ type GaAs region 24f are activated by annealing. Thereby, the n type GaAs layer 79 shown in FIG. 15(a) is formed.

Finally, as shown in FIG. 15(e), the drain electrode 8 is formed on the drain side n⁺ GaAs region 24f, and the source electrode 9 is formed on the source side n⁺ type GaAs region 24f, thereby completing the FET.

Alternative 1

In the described fabricating method, after the formation of the GaAs layer 32f, the photoresist 6f is formed. However, in place of the photoresist 6f, the sidewalls 51f and the photoresist 60f shown by a broken line in FIG. 15(d) may be used to form the FET. In this case, the insulating film 12 and the sidewall 51f that are formed later comprise different materials.

Using a process similar to that described above, as shown in FIG. 15(c), the GaAs layer 32e is formed and, thereafter, the sidewalls 51f are formed as in the first embodiment. In the case of this embodiment, because the surface of the GaAs semiconductor substrate is covered by the respective insulating films, unlike the prior art and the first embodiment, the n type GaAs layer 31j of the GaAs semiconductor substrate is not etched. Thereafter, the photoresist 60f which has an offset toward the drain side is formed as shown in FIG. 15(d).

After the formation of the sidewalls 51f, as shown in FIG. 15(d), using the gate electrode 4f, the sidewall 51f, and the photoresist 60f as a mask, and using the respective films as through films, Si is implanted into the GaAs semiconductor substrate. Thereby, on the n type GaAs layer 101 to which the i type GaAs layer 102 is changed, the n type GaAs layer 33f, comprising the n type GaAs region 21f, the n' type GaAs region 231f, and the n⁺ type GaAs region 240f, and the i type GaAs region 22f are formed. After the formation of the GaAs layer 33f, the FET is completed by the processes described above.

Figure 16:
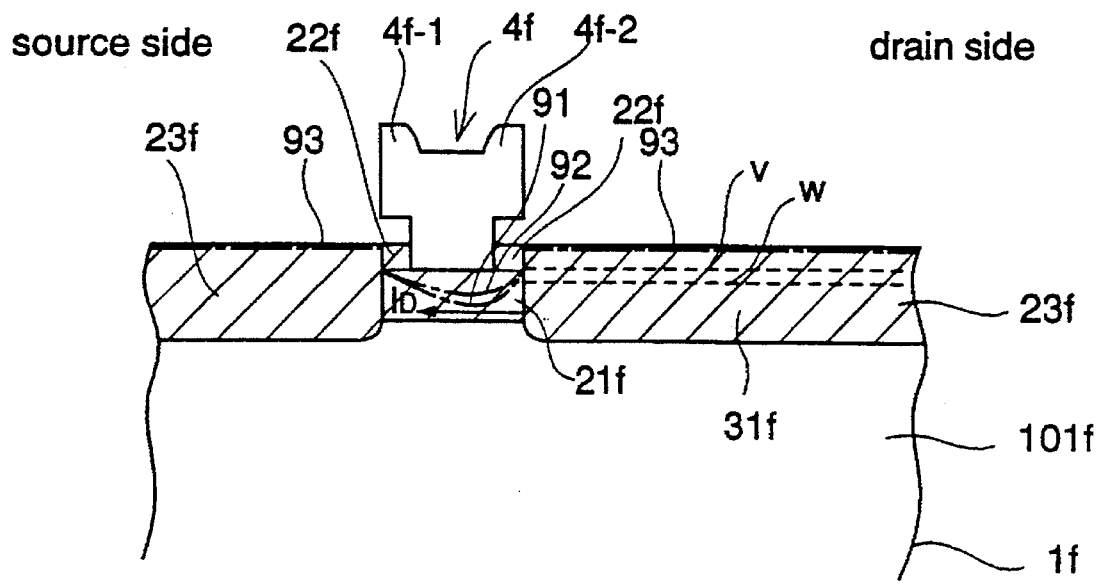
FIG. 16 is a cross-sectional view for explaining the operation of the sixth embodiment.

In FIG. 16, which is an enlarged cross-sectional view showing the vicinity of the gate electrode 4b, the same reference numerals as in FIG. 13 represent the same elements as described for the fifth embodiment. As shown in FIG. 16, in the FET of the sixth embodiment, as in the fifth embodiment, when a negative voltage is applied to the gate electrode 4f, the gate depletion layer is generated in the n type GaAs region 21f, whereby the drain current is controlled. In addition, in the FET of the sixth embodiment, the surface depletion layer is thinner than in the FET of the fifth embodiment and the channel is thicker, whereby channel confinement is relaxed.

In this sixth embodiment, the n type GaAs film 210f, the i type GaAs film, and the insulating film are successively formed on the i type GaAs layer 103 and, thereafter, portions of the insulating film and the i type GaAs film are removed to expose the gate region of the n type GaAs film 210f where the gate electrode 4b is formed. Electrode material is deposited on the gate region and to the respective ends of the insulating films adjacent to the gate region, thereby forming the gate electrode 4f. Then, using this gate electrode 4f as a mask and using the insulating film as a through film, Si is implanted into the GaAs semiconductor substrate. Therefore, it is possible to maintain the concentration of Si in the GaAs layer below the gate electrode 4f, including below the projecting parts 4f-1 and 4f-2, to form the i type GaAs region 22f on the n type GaAs region 21f and on the n type GaAs region below the projecting portions 4f-1 and 4f-2. As a result, as shown in FIG. 16, no surface depletion layer is produced below the i type GaAs region 22f in the n type GaAs region 21f, and even when any surface depletion layer is produced, its depth has no influence on the gate depletion layer. In addition, because it is possible to make the height of the junction interface between the n type GaAs region 21f and the gate electrode 4f lower than the interface of the n' type GaAs region 23f and the n⁺ type GaAs region 24f, the bottom of the surface depletion layer of the n' type GaAs region 23f and the n⁺ type GaAs region 24f can be made higher than the junction interface, whereby channel confinement of the n' type GaAs region 31f due to the surface depletion layer is further relaxed. Even when a voltage closer to 0 V is applied, the transconductance ($g_m$) is higher than in the fourth and fifth embodiments.

In addition, since the gate electrode 4 is disposed at a position closer to the source electrode 9 than to the drain electrode 8, between the drain electrode 8 and the source electrode 9, and the drain side n' type GaAs region 23f is longer than the length of the source side n' type GaAs region 23f, an electric field distribution at the periphery of the drain electrode 8 is prevented, whereby FET characteristics required for a high breakdown voltage and high power semiconductor device can be satisfied.

In addition, in Alternative 1 of this sixth embodiment, when the sidewall 51f is used, the sidewall 51f is formed on the insulating film 12, and the side wall is formed without engraving the GaAs semiconductor substrate, whereby the surface depletion layer generated at the n' type GaAs region 23f is shallower because there is no engraved part, resulting in relaxation of channel confinement.

Embodiment 7

Figure 17:
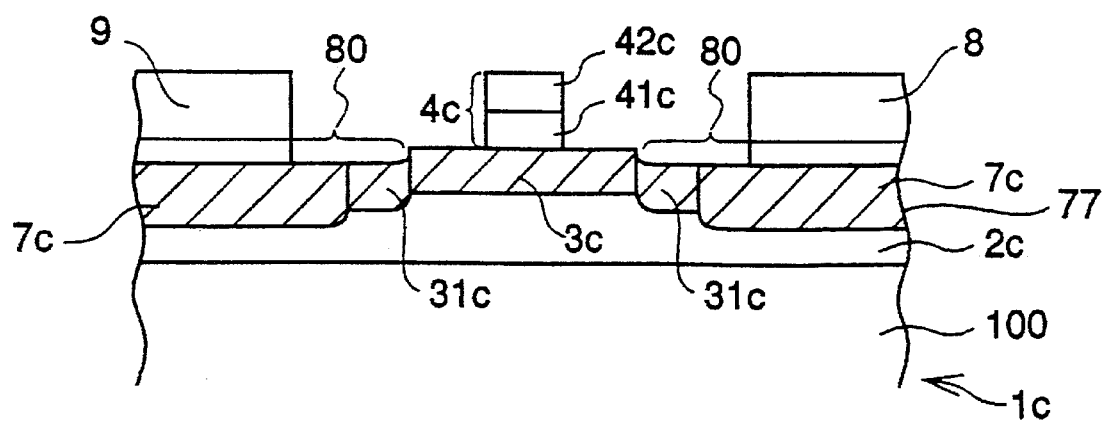
FIG. 17 is a cross-sectional view illustrating the semiconductor device of a seventh embodiment of the present invention.
Figure 18:
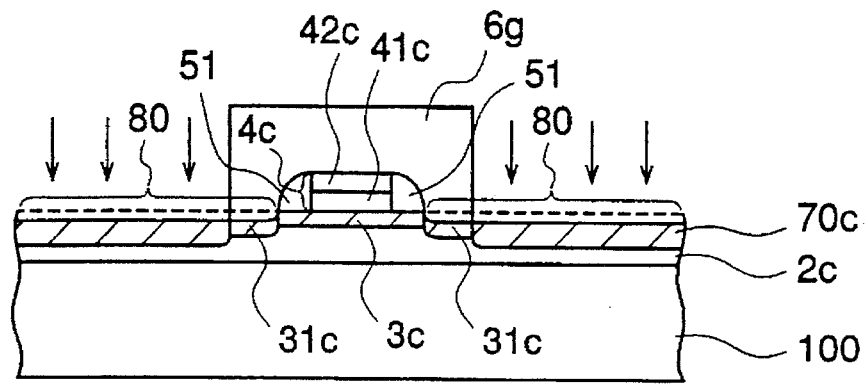
FIGS. 18(a) and 18(b) are cross-sectional views illustrating examples of processes for fabricating the semiconductor device of the seventh embodiment.
Figure 18:
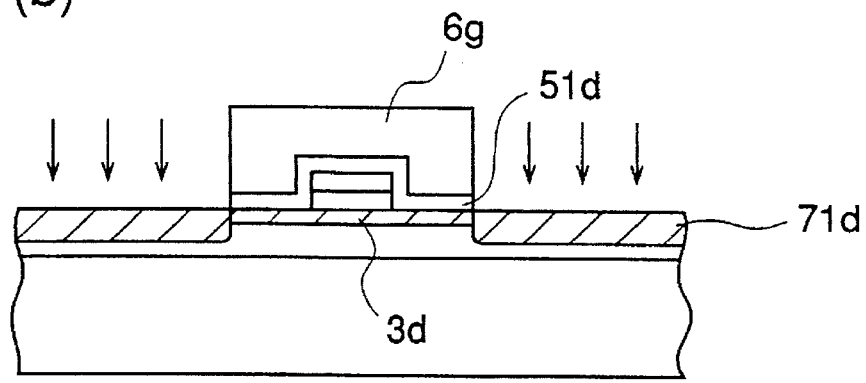

In FIG. 17 the same reference numerals as in FIG. 7 for the third embodiment designate the same or corresponding elements. The semiconductor device of FIG. 17 is a semiconductor switching device that has a gate electrode disposed at the center, between the drain electrode and the source electrode, and has n' type GaAs regions 31c of equal length in regions of the n type GaAs layer 77 at the drain side and at the source side of the gate electrode.

A method for fabricating the switching element of FIG. 17 is described with reference to FIGS. 18(a)–18(e). In FIGS. 18(a)–18(e), the same reference numerals designate the same or corresponding elements as in FIGS. 8(a)–9(f). Numeral 6g designates photoresist that is patterned to extend equal distances toward the source electrode 9 and the drain electrode 8 from the gate electrode 4c. Using processes similar to the third embodiment, the ion implantation shown in FIG. 8(c) is performed, and the n type GaAs region 3c and the n' type GaAs region 310 are produced.

As shown in FIG. 18(a), the resist 6g which is patterned to extend toward the source electrode 9 and the drain electrode 8 from the gate electrode 4c is formed, and Si is implanted using the resist 6g, the gate electrode 4c, and the sidewall 51 as a mask, thereby providing the n type GaAs layer comprising the n type GaAs region 3c, the n' type GaAs region 31c, and the n⁺ type GaAs region 70c.

The processes that are performed thereafter are the same as those of the third embodiment described with reference to FIGS. 8(a)–8(f).

Alternative 1

As an alternative of this fabricating method, the ion implantation shown in FIG. 9(c) may be performed by using processes similar to those shown in FIGS. 9(c) and 9(d) for the fourth embodiment of the present invention. The configuration of the photoresist 6d used for the ion implantation is formed as the resist 6g shown in FIG. 18(b), i.e., as the resist 6g that is patterned to extend toward the source electrode 9 and toward the drain electrode 8 with equal distances from the gate electrode 4c, whereby a semiconductor device having drain side and source side n' type GaAs regions 31c of equal lengths are obtained. The processes after the ion implantation are the same as those of the fourth embodiment.

In the fifth and the sixth embodiments, by making the resist 6e and 6f and the insulating film 1 the same lengths at the drain side and the source side of the gate electrode, a semiconductor device having the n' type GaAs region 3e and the n' type GaAs region 3f of the equal lengths at the drain side and the source side is obtained. This semiconductor device may be employed as a switching element.

This seventh embodiment relaxes channel confinement due to the surface depletion layer of the engraved part 80 by the n' type GaAs region 31c, as in the third embodiment. Furthermore, since the gate electrode is disposed at the center between the drain electrode and the source electrode and the n' type GaAs regions 31c have equal lengths, no high concentration n⁺ GaAs region is close to the gate electrode, whereby leakage current generated when a further large negative voltage is applied to the gate electrode is suppressed and the gate-drain breakdown voltage ($V_{gdo}$) and the gate-source breakdown voltage ($V_{gso}$) are equally high. Thereby, switching operation for high power transmission and reception is possible and a planar type high breakdown voltage switching device is realized. The planar type high breakdown voltage switching element is superior in uniformity relative to the recess type and can be fabricated at high yield.

Embodiment 8

FIGS. 1 to 18 show a single FET device or a single switching element. This eighth embodiment of the present invention includes an FET or switching element in a semiconductor device in which FETs are connected in parallel in accordance with their use or a multiple stage FET construction is adopted as a microwave monolithic integrated circuit (MMIC) or as a semiconductor device including a switching element.

An MMIC may include a plurality of elements, such as a low noise amplifier or a logic circuit, and the like, including FETs with the usual BPLDD structure or LDD structure in a SAGFET using a conventional wafer process.

Figure 23:
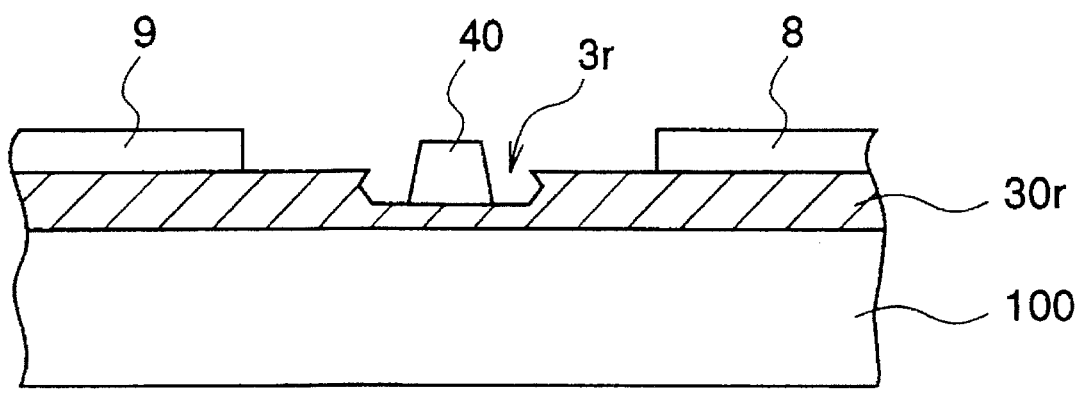
FIG. 23 is a cross-sectional view illustrating a prior art switching element with high breakdown voltage.

Semiconductor devices that require a high breakdown voltage usually have fundamentally different structures depending on their use. For example, switching elements for which high breakdown voltages are required use a recess structure, as shown in FIG. 23. A high breakdown voltage FET uses a planar structure such as an SAGFET as described in the first to sixth embodiments. It was very difficult to integrate on the same wafer semiconductor elements having these fundamentally different structures. However, by employing the planar type high breakdown switching element of this seventh embodiment, it is possible to fabricate integrated circuits with only planar elements in the same processes, improving uniformity on a wafer and yield.

In this seventh embodiment, by using the planar type high breakdown voltage SAGFET and the planar type high breakdown switching elements, switching elements can be formed using the same process flow as that for forming the SAGFET. An integrated circuit, such as an MMIC, can be fabricated using planar processes, whereby an MMIC can be fabricated with high yield.

While in the above-described embodiments, GaAs is used as a semiconductor substrate, a glass-based or silicon-based semiconductor substrate may be used with the same effects as in the respective embodiments.

What is claimed is:

1. Field effect transistor structures comprising:

a semiconductor substrate;

at least one first unit semiconductor device on the substrate having a first drain electrode, a first source electrode, and a first gate electrode disposed between the first drain electrode and the first source electrode, closer to the first source electrode than to the first drain electrode, and a semiconductor layer on a surface region of the semiconductor substrate of the first unit semiconductor device, the semiconductor layer including:

a first concentration region including dopant impurities selected from the group consisting of donors and acceptors in a first concentration and having a portion on which the first gate electrode having a first length is disposed;

a drain side second concentration region including dopant impurities producing the same conductivity type as the dopant impurities included in the first concentration region in a second concentration, larger than the first concentration, and disposed adjacent the first concentration region at a drain side end of the first concentration region, spaced apart from the gate electrode, and having a second length toward the drain electrode;

a source side second concentration region including dopant impurities producing the same conductivity type as the dopant impurities included in the first concentration region in the second concentration and disposed adjacent the first concentration region, at a source side end of the first concentration region, spaced apart from the gate electrode, and having a third length toward the source electrode;

a drain side third concentration region including dopant impurities producing the same conductivity type as the dopant impurities included in the first concentration region in a third concentration larger than the second concentration and disposed adjacent the drain side second concentration region at a drain side end of the drain side second concentration region; and a source side third concentration region including dopant impurities producing the same conductivity type as the dopant impurities included in the first concentration region in the third concentration and disposed adjacent the source side second concentration region at a source side end of the source side second concentration region wherein the drain electrode is disposed on a portion of the drain side third concentration region and the source electrode is disposed on a portion of the source side third concentration region; and at least one second unit semiconductor device on the substrate and having a second drain electrode, a second source electrode, and a second gate electrode disposed between the second drain electrode and the second source electrode, equally distant from the second source electrode and from the second drain electrode.

* * * * *